United States Patent
Takao et al.

(10) Patent No.: US 8,039,864 B2
(45) Date of Patent: Oct. 18, 2011

(54) SEMICONDUCTOR LIGHT EMITTING DEVICE AND FABRICATION METHOD FOR THE SAME

(75) Inventors: Masakazu Takao, Kyoto (JP); Mitsuhiko Sakai, Kyoto (JP); Shunji Nakata, Kyoto (JP)

(73) Assignee: Rohm Co., Ltd. (JP)

( * ) Notice: Subject to any disclaimer, the term of this patent is extended or adjusted under 35 U.S.C. 154(b) by 60 days.

(21) Appl. No.: 12/452,027

(22) PCT Filed: Jun. 6, 2008

(86) PCT No.: PCT/JP2008/060476
§ 371 (c)(1),
(2), (4) Date: Dec. 11, 2009

(87) PCT Pub. No.: WO2008/152988
PCT Pub. Date: Dec. 18, 2008

(65) Prior Publication Data
US 2010/0133505 A1  Jun. 3, 2010

(30) Foreign Application Priority Data
Jun. 13, 2007  (JP) .................. 2007-156381

(51) Int. Cl.
*H01L 33/00* (2010.01)
(52) U.S. Cl. ............... 257/99; 257/96; 257/E33.068; 438/26; 438/29; 438/42
(58) Field of Classification Search .......... 257/99, 257/98, E33.068; 438/26, 29, 42
See application file for complete search history.

(56) References Cited

U.S. PATENT DOCUMENTS

| 5,376,580 A | 12/1994 | Kish et al. |
| 7,705,465 B2 * | 4/2010 | Kimura et al. ............ 257/774 |

FOREIGN PATENT DOCUMENTS

| JP | 06-302857 A | 10/1994 |
| JP | 11-103090 A | 4/1999 |
| JP | 2004-146593 A | 5/2004 |
| JP | 2005-044887 A | 2/2005 |
| JP | 2005-223207 A | 8/2005 |
| JP | 2005-236304 A | 9/2005 |
| JP | 2005-353809 A | 12/2005 |

* cited by examiner

*Primary Examiner* — Tu-Tu Ho
(74) *Attorney, Agent, or Firm* — Rabin & Berdo, PC

(57) ABSTRACT

A high luminance semiconductor light emitting device and a fabrication method for such semiconductor light emitting device are provided by forming a metallic reflecting layer using a non-transparent semiconductor substrate.

The high luminance semiconductor light emitting device comprises: a GaAs substrate structure including a GaAs layer (3), a first metal buffer layer (2) disposed on a surface of the GaAs layer, a first metal layer (1) disposed on the first metal buffer layer, and a second metal buffer layer (4) and a second metal layer (5) disposed at a back side of the GaAs layer; and a light emitting diode structure disposed on the GaAs substrate structure and including a third metal layer (12), a metal contact layer (11) disposed on the third metal layer, a p type cladding layer (10) disposed on the metal contact layer, a multi-quantum well layer (9) disposed on the p type cladding layer, an n type cladding layer (8) disposed on the multi-quantum well layer, and a window layer (7) disposed on the n type cladding layer, wherein the GaAs substrate structure and the light emitting diode structure are bonded by using the first metal layer (1) and the third metal layer (12).

20 Claims, 15 Drawing Sheets

US 8,039,864 B2

SEMICONDUCTOR LIGHT EMITTING DEVICE AND FABRICATION METHOD FOR THE SAME

TECHNICAL FIELD

The present invention relates to a semiconductor light emitting device and a fabrication method for such semiconductor light emitting device, and in particular, relates to a semiconductor light emitting device formed for bonding a light emitting diode having a metallic reflecting layer, and a non-transparent substrate layer by wafer bonding technology, and a fabrication method for such semiconductor light emitting device.

BACKGROUND ART

A structure which forms a metallic reflecting layer as an optical reflecting layer between a substrate and an active layer composed of an MQW (Multi-Quantum Well) layer is proposed in order to perform the high brightness of an LED (Light Emitting Diode). As a method of forming such a metallic reflecting layer, it is disclosed about the wafer bonding technology of a substrate of a light emitting diode layer (Refer to Patent Literature 1 and Patent Literature 2, for example).

In Patent Literature 1 and Patent Literature 2, the purpose is to provide a fabrication method of a light emitting diode which can fabricate a light emitting diode having a desired mechanical characteristic and optical transparency, and can make a minimum specific electrical resistivity of boundary surface between a transparent layer and a growth layer; and it is characterized by fabricating the light emitting diode by removing a temporary growth substrate after growing up a light emitting diode layer one after another on the temporary growth substrate and forming a light emitting diode structure having a relatively thin layer, and wafer-bonding a conductive and optical transparent substrate on the light emitting diode layer which becomes a buffer layer of lower layer on the position instead of the temporary growth substrate. In Patent Literature 1 and Patent Literature 2, transparent materials, such as GaP and sapphire, are applied to the substrate used for the wafer bonding.

FIG. 1 to FIG. 3 show schematic cross-section structures of a conventional semiconductor light emitting device formed by the wafer bonding technology.

For example, as shown in FIG. 1, a conventional semiconductor light emitting device includes: an Au—Sn alloy layer 14 disposed on a GaAs substrate 15; a barrier metal layer 13 disposed on the Au—Sn alloy layer 14; a p type cladding layer 10 disposed on the barrier metal layer 13; an MQW layer 9 disposed on the p type cladding layer 10; an n type cladding layer 8 disposed on the MQW layer 9; and a window layer 7 disposed on the n type cladding layer 8.

In the conventional semiconductor light emitting device shown in FIG. 1, the metal used for the wafer bonding is Au—Sn alloy. As for the Au—Sn alloy, since the melting point is low, the Au—Sn alloy at the side of an epitaxial growth layer composing an LED in low temperature, and the Au—Sn alloy at the side of the GaAs substrate 15 can be melted and bonded.

However, since the thermal diffusion of Sn occurs when using the Au—Sn alloy layer 14, in order to prevent the diffusion of Sn, as shown in FIG. 1, it is necessary to insert the barrier metal layer 13. Moreover, there is a problem that the Au—Sn alloy layer 14 has a low optical reflection factor.

For example, as shown in FIG. 2, another conventional semiconductor light emitting device includes: a metallic reflecting layer 16 disposed on a GaAs substrate 15; a p type cladding layer 10 disposed on the metallic reflecting layer 16; an MQW layer 9 disposed on the p type cladding layer 10; an n type cladding layer 8 disposed on the MQW layer 9; and a window layer 7 disposed on the n type cladding layer 8. In the conventional semiconductor light emitting device shown in FIG. 2, there is a problem that light cannot be efficiently reflected from the metallic reflecting layer 16 fabricated by bonding the GaAs substrate 15 since the optical absorption occurs in the interface between metal and a semiconductor. That is, there is a problem that the optical absorption occurs in the interface between the p type cladding layer 10 and the metallic reflecting layer 16.

In order to perform high brightness of the semiconductor LED (Light Emitting Device), there is also a method of inserting a DBR (Distributed Bragg Reflector) layer between the GaAs substrate and the active layer (MQW) as an optical reflecting layer. The LED of the structure which does not insert the DBR becomes dark since the light which emitted from the MQW layer is absorbed by the GaAs substrate. Therefore, in order to perform the high brightness of the LED using the GaAs substrate, the DBR is used as the optical reflecting layer, for example.

That is, as shown in FIG. 3, another conventional semiconductor light emitting device includes: a DBR layer 19 disposed on a GaAs substrate 15; a p type cladding layer 10 disposed on the DBR layer 19; an MQW layer 9 disposed on the p type cladding layer 10; an n type cladding layer 8 disposed on the MQW layer 9; and a window layer 7 disposed on the n type cladding layer 8. In the conventional semiconductor light emitting device shown in FIG. 3, the DBR layer 19 is used as an optical reflecting layer between the GaAs substrate 15 and the MQW layer 9. However, there is a problem that the DBR layer 19 reflects only an incident light from a certain one way, the DBR does not reflect light if an incident angle changes, and the DBR layer 19 does not reflects an incident light from other angle and then the incident light passes through. Therefore, there is a problem that the passed through light is absorbed in the GaAs substrate 15 and the light emitting brightness of the semiconductor LED (Light Emitting Device) is reduced.

The conventional semiconductor light emitting device formed by the wafer bonding technology needs to insert the barrier metal layer, in order to prevent the thermal diffusion of Sn, when using the Au—Sn alloy layer as a metal used for the wafer bonding. Moreover, the Au—Sn alloy layer has a low optical reflection factor.

Moreover, even if the metallic reflecting layer is formed by bonding the substrate, the optical absorption occurs in the interface between the metal and the semiconductor, and then the light cannot be reflected efficiently.

Moreover, as mentioned above, when the DBR layer is used as the reflecting layer, the DBR layer reflects only an incident light from a certain one way, the DBR layer does not reflect and passes through the incident light if an incident angle changes, and the incident light is absorbed by the GaAs substrate, thereby the light emitting brightness of LED is reduced.

Furthermore, there is a problem that the conventional semiconductor light emitting device is easy to be removed if high temperature is applied since the conventional semiconductor light emitting device formed by the wafer bonding technology has the difference in a coefficient of thermal expansion and a problem of adhesion when bonding a semiconductor substrate, an insulating film, and a metal layer.

Furthermore, it is disclosed also about a semiconductor light emitting device bonds a layered structure and a semiconductor substrate of the semiconductor light emitting device by using an adhesive agent instead of the wafer bonding technology, and a fabricating method for such the semiconductor light emitting device (for example, refer to Patent Literature 3).

Patent Literature 1: Japanese Patent Application Laying-Open Publication No. H06-302857
Patent Literature 2: U.S. Pat. No. 5,376,580
Patent Literature 3: Japanese Patent Application Laying-Open Publication No. 2005-223207

DISCLOSURE OF INVENTION

Technical Problem

The purpose of the present invention is to provide a semiconductor light emitting device with the high luminance formed by performing the wafer bonding of a substrate with sufficient adhesion using a non-transparent semiconductor substrate, such as GaAs and Si, by using wafer bonding technology and forming the metallic reflecting layer, and a fabrication method for such semiconductor light emitting device.

Moreover, the purpose of a present invention is to provide a semiconductor light emitting device with the high luminance formed by avoiding the contact between a semiconductor and metal, preventing the optical absorption in the interface between the semiconductor and the metal, and forming the metallic reflecting layer having a sufficient reflection factor, by inserting a transparent insulating film between the metal and the semiconductor, and a fabrication method for such semiconductor light emitting device.

Moreover, the purpose of the present invention is to provide a semiconductor light emitting device with the high luminance which becomes possible to reflect the light of all angles by using not the DBR but a metal layer for the optical reflecting layer, and a fabrication method for such semiconductor light emitting device.

Solution to Problem

According to one aspect of the present invention for achieving the above-mentioned purpose, it is provided of a semiconductor light emitting device comprising: a GaAs substrate structure including a GaAs layer forming a plurality of trench regions on a surface, a first metal buffer layer disposed on the surface of the GaAs layer, at a sidewall of the trench region, and on a bottom surface of the trench region, a first metal layer disposed on the first metal buffer layer, a second metal buffer layer disposed at a back side of the GaAs layer, and a second metal layer disposed on a surface of the opposite side with the GaAs layer of the second metal buffer layer; and a light emitting diode structure disposed on the GaAs substrate structure and including a third metal layer, a metal contact layer disposed on the third metal layer, a p type cladding layer disposed on the metal contact layer, a multi-quantum well layer disposed on the p type cladding layer, an n type cladding layer disposed on the multi-quantum well layer, and a window layer disposed on the n type cladding layer, wherein the GaAs substrate structure and the light emitting diode structure are bonded using the first metal layer and the third metal layer disposed on the surface of the GaAs layer, and an air gap exists between the first metal layer of the trench region and the third metal layer.

According to another aspect of the present invention, it is provided of a semiconductor light emitting device comprising: a GaAs substrate forming a plurality of trench regions on a surface; and a light emitting diode structure including a metal layer disposed on the surface of the GaAs substrate, at a sidewall of the trench region, and on a bottom surface of the trench region, a patterned metal contact layer and a patterned insulating layer disposed on the metal layer on the surface of the GaAs substrate, a p type cladding layer disposed on the patterned metal contact layer and the patterned insulating layer, a multi-quantum well layer disposed on the p type cladding layer, an n type cladding layer disposed on the multi-quantum well layer, and a window layer disposed on the n type cladding layer, wherein the GaAs substrate and the light emitting diode structure are bonded using the metal layer on the surface of the GaAs substrate, and an air gap exists between the metal layer of the trench region and the light emitting diode structure.

According to another aspect of the present invention, it is provided of a semiconductor light emitting device comprising: a GaAs substrate structure including a GaAs substrate forming a plurality of trench regions on a surface, and a first metal layer disposed on the surface of the GaAs substrate, at a sidewall of the trench region, and on a bottom surface of the trench region; and a light emitting diode structure disposed on the GaAs substrate structure and including a second metal layer, a p type cladding layer disposed on the second metal layer, a multi-quantum well layer disposed on the p type cladding layer, an n type cladding layer disposed on the multi-quantum well layer, and a window layer disposed on the n type cladding layer, wherein the GaAs substrate and the light emitting diode structure are bonded using the first metal layer and the second metal layer on the surface of the GaAs substrate, and an air gap exists between the first metal layer of the trench region and the light emitting diode structure.

According to another aspect of the present invention, it is provided of a semiconductor light emitting device comprising: a silicon substrate structure including a silicon substrate forming a plurality of trench regions on a surface, a titanium layer disposed on the surface of the silicon substrate, at a sidewall of the said trench region, and on a bottom surface of the trench region, and a first metal layer disposed on the titanium layer; and a light emitting diode structure including a second metal layer disposed on the first metal layer, a patterned metal contact layer and a patterned insulating layer disposed on the second metal layer, an epitaxial growth layer disposed on the patterned metal contact layer and the patterned insulating layer and having a frosting processing region on a surface exposed, a patterned n type GaAs layer disposed on the epitaxial growth layer, and a patterned surface electrode layer disposed on the n type GaAs layer, wherein the silicon substrate structure and the light emitting diode structure are bonded using the first metal layer and the second metal layer on the surface of the silicon substrate, and an air gap exists between the first metal layer of the trench region and the LED structure.

According to another aspect of the present invention, it is provided of a semiconductor light emitting device comprising: a GaAs substrate structure including a GaAs substrate forming a plurality of trench regions on a surface, a metal buffer layer disposed on the surface of the GaAs substrate, at a sidewall of the trench region, and on a bottom surface of the trench region, and a first metal layer disposed on the metal buffer layer; and a light emitting diode structure including a second metal layer disposed on the first metal layer, a patterned metal contact layer and a patterned insulating layer disposed on the second metal layer, an epitaxial growth layer disposed on the patterned metal contact layer and the patterned insulating layer and having a frosting processing region on a surface exposed, a patterned n type GaAs layer disposed on the epitaxial growth layer, and a patterned surface electrode layer disposed on the n type GaAs layer, wherein the GaAs substrate structure and the light emitting diode structure are bonded using the first metal layer and the second metal layer on the surface of the GaAs substrate, and an air gap exists between the first metal layer of the trench region and the LED structure disposed on the second metal layer.

According to another aspect of the present invention, it is provided of a fabrication method for a semiconductor light emitting device comprising: preparing a semiconductor substrate structure for wafer bonding and a light emitting diode structure for wafer bonding; forming a first metal layer on a semiconductor substrate after forming a plurality of trench regions on a surface of the semiconductor substrate, in the semiconductor substrate structure; forming an AlInGaP layer, an n type GaAs layer, and an epitaxial growth layer one after another on a GaAs substrate, in the light emitting diode structure; forming a metal contact layer and a second metal layer for a patterned insulating layer, on the epitaxial growth layer; bonding the semiconductor substrate and the light emitting diode structure for wafer bonding by thermocompression bonding using the first metal layer on the surface of the semiconductor substrate, and forming an air gap between the first metal layer of the trench region and the light emitting diode structure; removing the GaAs substrate by etching; removing the AlInGaP layer; performing pattern formation of a surface electrode layer; and removing the n type GaAs layers except the n type GaAs layer directly under the surface electrode layer by performing frosting processing.

Advantageous Effects of Invention

According to the semiconductor light emitting device and the fabrication method for such semiconductor light emitting device according to the present invention, the high brightness of the LED can be achieved since the barrier metal becomes unnecessary by bonding the epitaxial growth layer and the semiconductor substrate with sufficient adhesion by using the metal layer composed of Au by using wafer bonding technology in order to solve the problem of Sn diffusion by Au—Sn alloy layer, and the metallic reflecting layer having a sufficient optical reflection factor can be formed in the structure at the side of the LED by using the metal layer composed of Au.

According to the semiconductor light emitting device and the fabrication method for such semiconductor light emitting device according to the present invention, the high brightness of the LED can be achieved since the contact with the semiconductor layer and the metallic reflecting layer can be avoided, the optical absorption in the interface between the semiconductor layer and the metallic reflecting layer can be prevented, and the metallic reflecting layer having a sufficient reflection factor can be formed, by inserting the transparent insulating film between the metallic reflecting layer and the semiconductor layer.

According to the semiconductor light emitting device, and the fabrication method for such semiconductor light emitting device according to the present invention, the high brightness of the LED can be performed since it is possible to perform the total reflection of the light by using the metal for the reflecting layer in order to prevent the optical absorption in the GaAs substrate, to prevent the absorption in the GaAs substrate, and to reflect the light of all angles.

Figure 1:
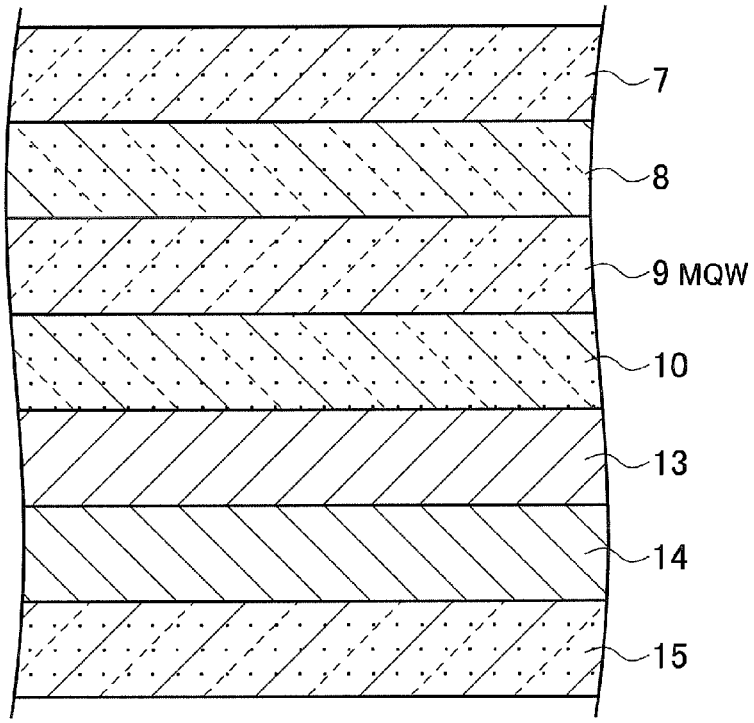
FIG. 1 It is a schematic cross-sectional configuration chart of a conventional semiconductor light emitting device.
Figure 2:
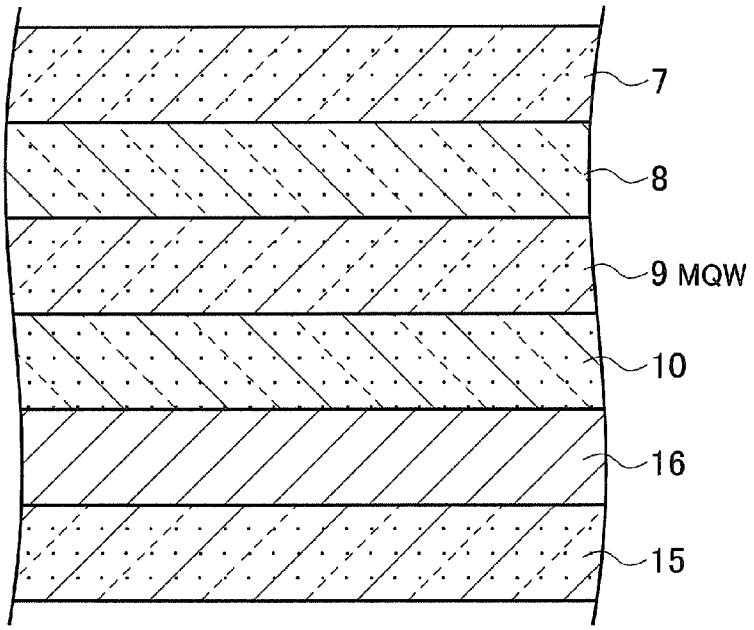
FIG. 2 It is another schematic cross-sectional configuration chart of the conventional semiconductor light emitting device.
Figure 3:
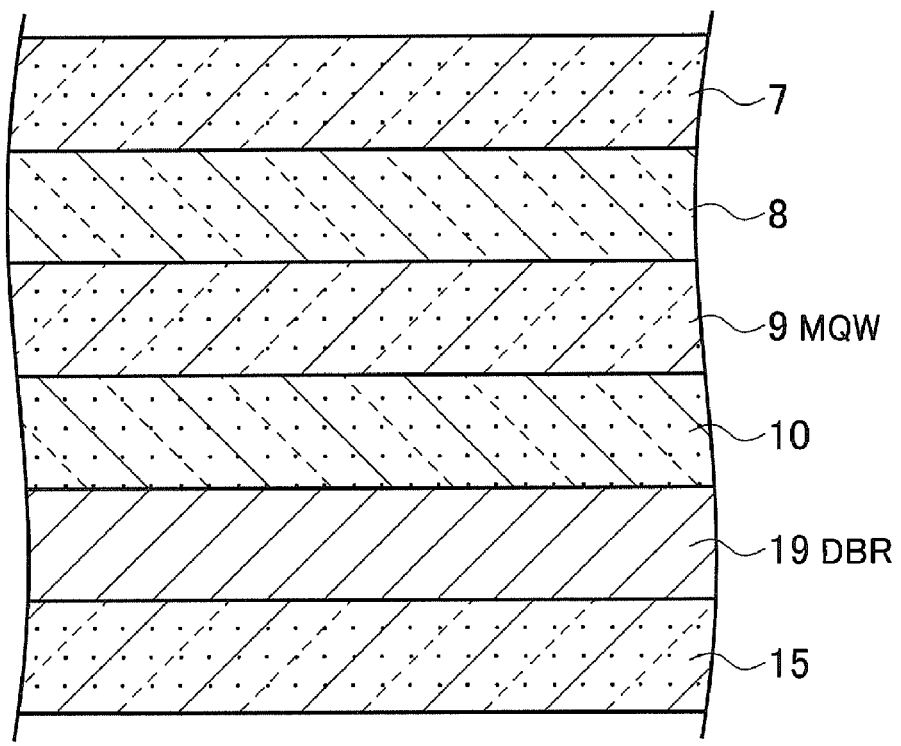
FIG. 3 It is another schematic cross-sectional configuration chart of the conventional semiconductor light emitting device.

REFERENCE SIGNS LIST 1, 5, 12, 20, 33: Metal layer (Au layer);
2, 4, 18: Metal buffer layer;
3: p type GaAs layer;
6: n type GaAs layer;
7: Window layer;
8: n type cladding layer;
9: Multi-quantum well (MQW) layer;
10: p type cladding layer;
11: Metal contact layer (AuBe—Ni alloy);
15, 23: GaAs substrate;
17: Insulating layer;
21: Silicon (Si) substrate;
22, 27: Titanium (Ti) layer;
24: AlInGaP layer;
25: n type GaAs layer;
26: Epitaxial growth layer;
29: Surface electrode layer;
30: Frosting processing area;
31: Blocking layer;
32, 34: Metal buffer layer (AuGe—Ni alloy);
28, 35: Back surface electrode layer; and
40: Air gap (aperture).

DESCRIPTION OF EMBODIMENTS

Next, an embodiment of the invention is described with reference to drawings. In the description of the following drawings, the same or similar reference numeral is attached to the same or similar part. However, a drawing is schematic and it should care about differing from an actual thing. Drawings are schematic, not actual, and may be inconsistent in between in scale, ratio, etc.

The embodiment shown in the following exemplifies the device and method for materializing the technical idea of the invention, and the technical idea of the invention does not specify assignment of each component parts, etc. as the following. Various changes can be added to the technical idea of the invention in scope of claims.

First Embodiment

Element Structure

Figure 4:
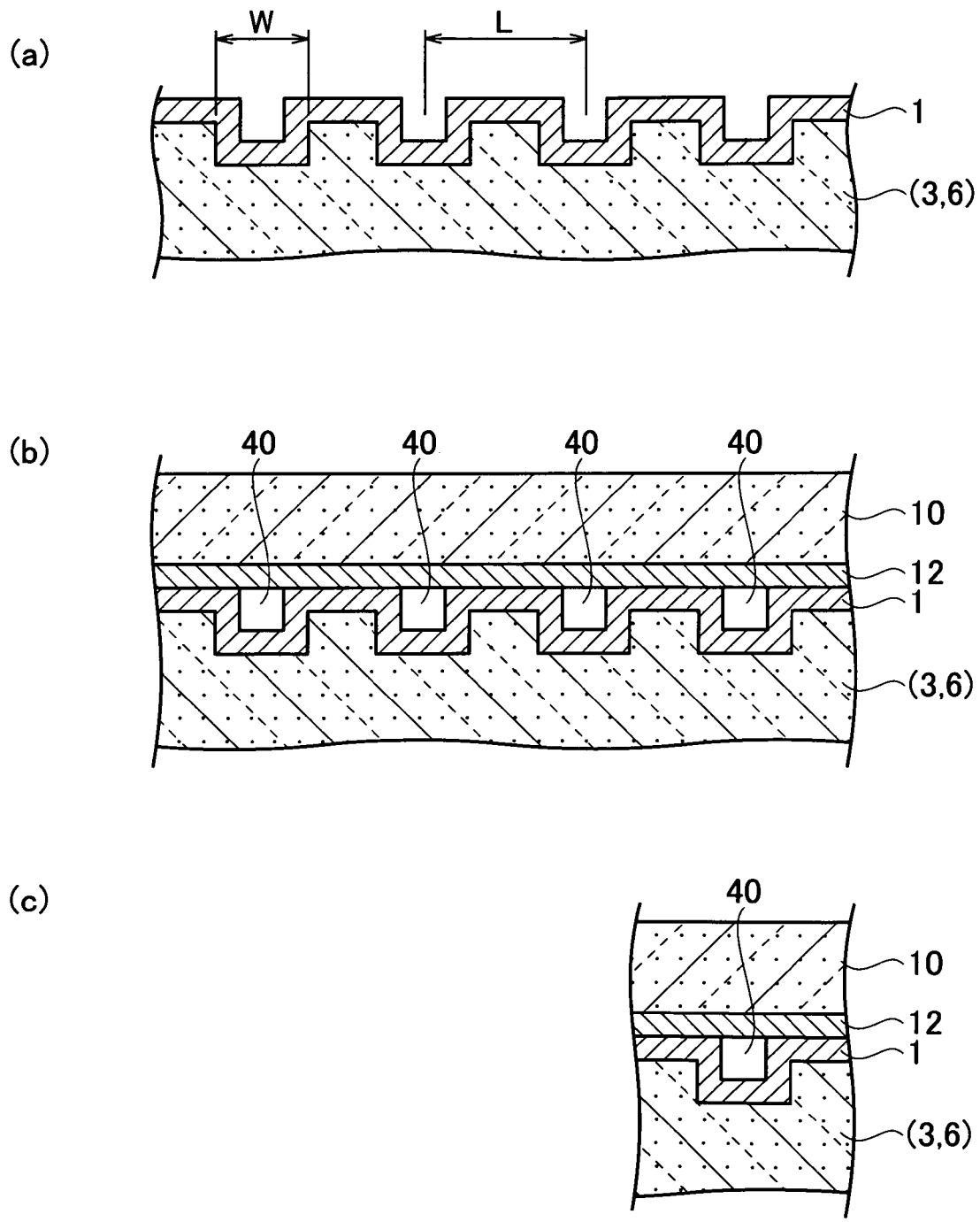
FIG. 4 It is a principle explanatory diagram of a semiconductor light emitting device according to an embodiment of the present invention, and a fabrication method for such semiconductor light emitting device, and
(a) a schematic cross-sectional configuration chart of a GaAs substrate,
(b) a schematic cross-sectional configuration chart after wafer bonding, and
(c) a schematic cross-sectional configuration chart after chip making.

As shown in FIG. 4(a), a p type or n type GaAs substrate applied to a semiconductor light emitting device according to the embodiment of the present invention and a fabrication method for such semiconductor light emitting device includes: a p type or n type GaAs layer (3, 6); and a metal layer 1 disposed on a surface of the p type or n type GaAs layer (3, 6) in which a trench(es) of stripe shape having the pitch L and the width W is formed. The width W of the stripe trench is about 10 μm, about 30 μm, or about 60 μm, for example, and the pitch L is about 100 μm, about 200 μm, about 410 μm, about 1000 μm, or about 2000 μm, for example. In addition, the trench region may not be limited to stripe shape and may be lattice-like shape, dot shape, swirl shape, hexagonal pattern shape, etc. Moreover, the depth of a trench region is formed to the same grade as the width W of the stripe, or more shallowly than the depth of the width W of the stripe.

FIG. 4(b) shows a schematic cross-section structure of a semiconductor light emitting device formed by bonding mutually the GaAs substrate shown in FIG. 4(a) and an LED by wafer bonding technology. The LED side is shown by a p type cladding layer 10 formed by epitaxial growth, for example and a metal layer 12 formed on the p type cladding layer 10, and other active layers are omitted in the illustration. The GaAs substrate and the LED are bonded by using the metal layer 1 disposed on the surface of the GaAs layer (3, 6), and an air gap(s) 40 exists between the metal layer 1 of the trench region and the metal layer 12.

That is, when bonding the LED on the GaAs substrate by the wafer bonding technology, the loophole of air can be made and the stress occurred in the thermal expansion at the time of high temperature annealing can be relaxed by forming such a trench region on the surface of the GaAs substrate. As a result, it can be prevented from the removal between each layers according to the difference in the coefficient of thermal expansion of the semiconductor substrate, the insulating film, and the metal layer.

FIG. 4(c) shows a schematic cross-sectional configuration chart after chip making. The air gap 40 formed in the trench region of stripe shape formed on the surface of the p type or n type GaAs substrate is included in the completed chip. If the pitch L is large, the air gap 40 may not be included in the completed chip.

Figure 5:
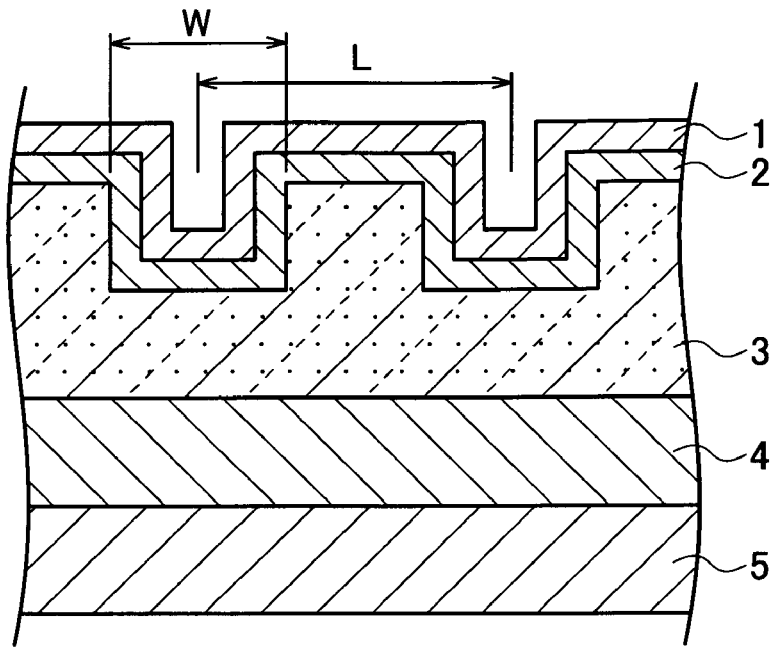
FIG. 5 It is a schematic cross-sectional configuration chart of a p type GaAs substrate applied to a semiconductor light emitting device and a fabrication method for such semiconductor light emitting device according to a first embodiment of the present invention.
Figure 6:
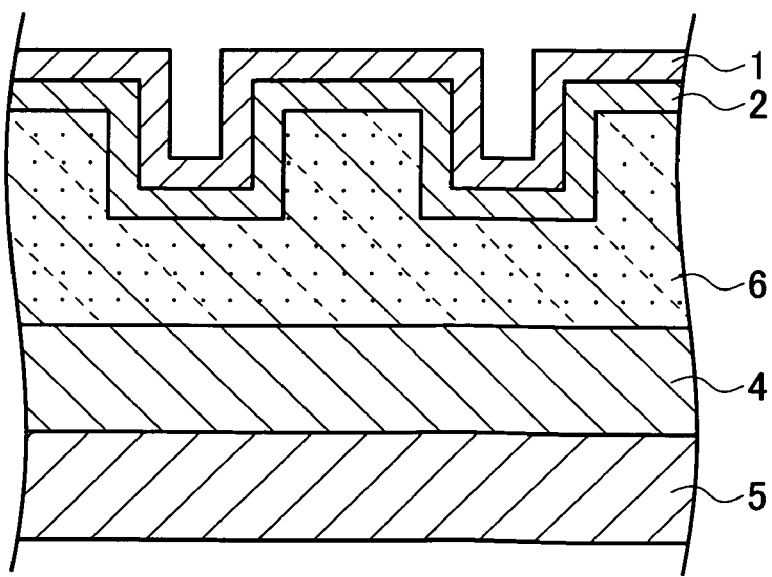
FIG. 6 It is a schematic cross-sectional configuration chart of an n type GaAs substrate applied to the semiconductor light emitting device and the fabrication method for such semiconductor light emitting device according to the first embodiment of the present invention.

As a conductivity type of the GaAs substrate applied to the semiconductor light emitting device according to the first embodiment, and the fabrication method for such semiconductor light emitting device, either the p type or the n type is applicable. FIG. 5 shows a schematic cross-section structure of a p type GaAs substrate and FIG. 6 shows a schematic cross-section structure of an n type GaAs substrate applied to the semiconductor light emitting device according to the first embodiment, and the fabrication method for such semiconductor light emitting device. Moreover, FIG. 7 shows a schematic cross-section structure of LED applied to the semiconductor light emitting device according to the first embodiment and the fabrication method for such semiconductor light emitting device.

Figure 7:
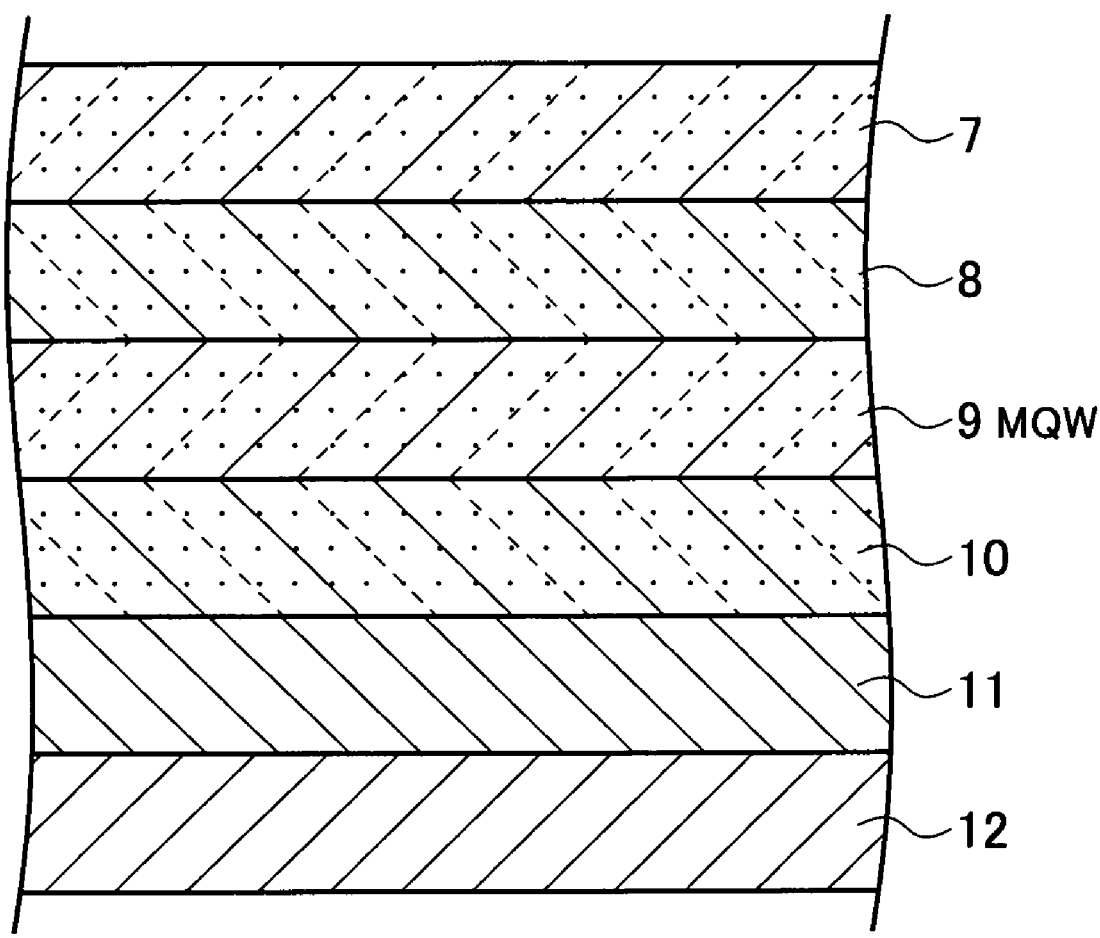
FIG. 7 It is a schematic cross-sectional configuration chart of an LED applied to the semiconductor light emitting device and the fabrication method for such semiconductor light emitting device according to the first embodiment of the present invention.
Figure 8:
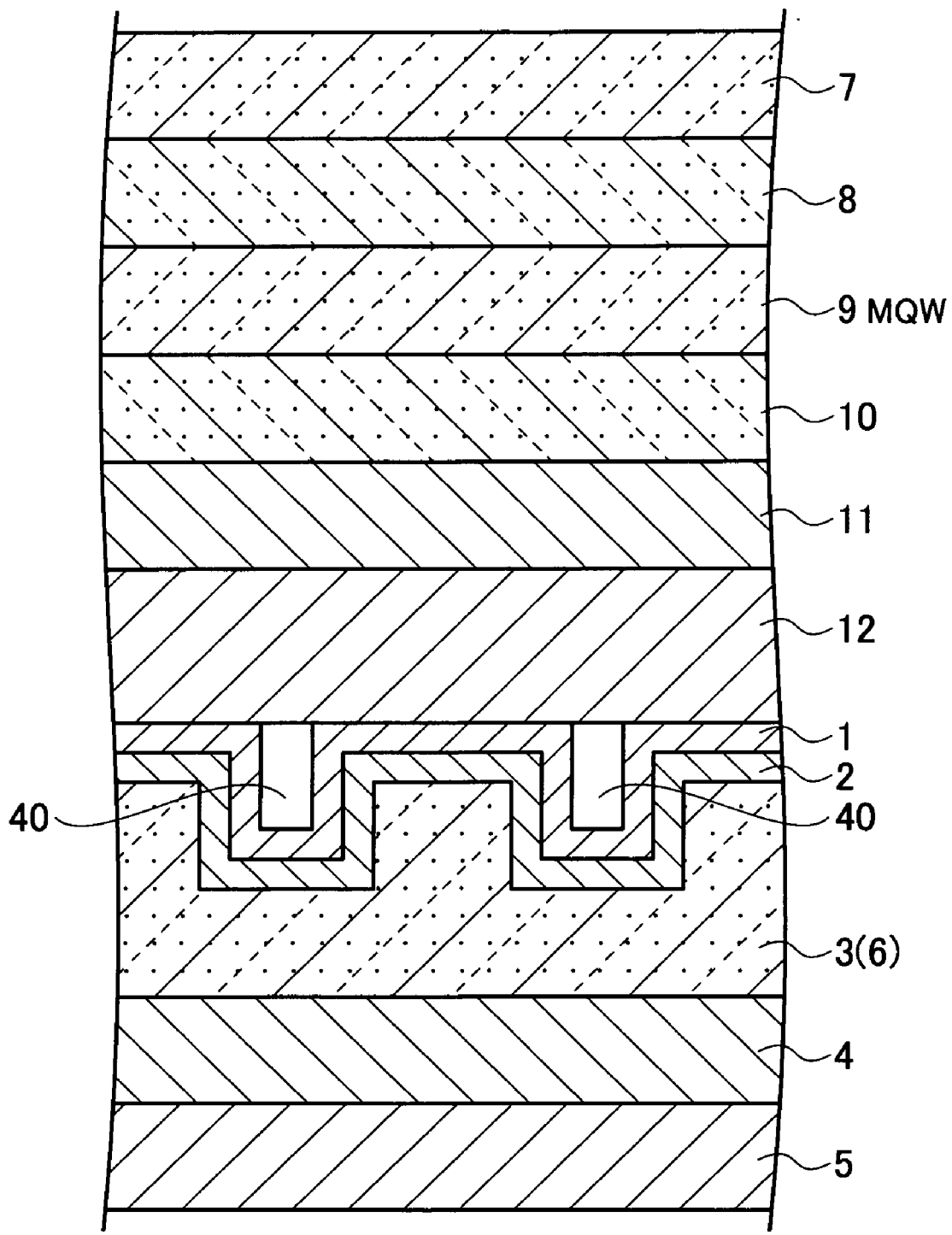
FIG. 8 It is a schematic cross-sectional configuration chart of the semiconductor light emitting device according to the 1st embodiment of the present invention.

FIG. 8 shows a schematic cross-section structure of a semiconductor light emitting device according to the first embodiment formed by bonding mutually the p type or n type GaAs substrate shown in FIG. 5 to FIG. 6 and the LED shown in FIG. 7 by the wafer bonding technology.

As shown in FIG. 5, the p type GaAs substrate applied to the semiconductor light emitting device according to the first embodiment and the fabrication method for such semiconductor light emitting device includes: a p type GaAs layer 3 forming a plurality of trench regions on a surface; a metal buffer layer 2 disposed on the surface of the p type GaAs layer 3, at a sidewall of the trench region, and on a bottom surface of the trench region; a metal layer 1 disposed on the metal buffer layer 2; a metal buffer layer 4 disposed on a back side of the p type GaAs layer 3; and a metal layer 5 disposed on a surface of the metal buffer layer 4 on the side opposite to the p type GaAs layer 3.

As shown in FIG. 6, the n type GaAs substrate applied to the semiconductor light emitting device according to the first embodiment and the fabrication method for such semiconductor light emitting device includes: an n type GaAs layer 6 forming a plurality of trench regions on a surface; a metal buffer layer 2 disposed on the surface of the n type GaAs layer 6, at a sidewall of the trench region, and on a bottom surface of the trench region; a metal layer 1 disposed on the metal buffer layer 2; a metal buffer layer 4 disposed at a back side of the n type GaAs layer 6; and a metal layer 5 disposed on a surface of the metal buffer layer 4 on the side opposite to the n type GaAs layer 6.

In the structure of FIG. 5, the metal layers 1 and 5 are all formed of an Au layer, and the metal buffer layers 2 and 4 can be all formed of, for example, an AuBe layer in order to achieve the electrical contact to the p type GaAs layer 3. Moreover, in the structure of FIG. 6, the metal layers 1 and 5 are all formed of an Au layer, and the metal buffer layers 2 and 4 can be all formed of, for example, an AuGe layer in order to achieve the electrical contact to the n type GaAs layer 6.

As shown in FIG. 7, a schematic cross-section structure of the LED applied to the semiconductor light emitting device according to the first embodiment and the fabrication method for such semiconductor light emitting device includes: a metal layer 12; a metal contact layer 11 disposed on the metal layer 12; a p type cladding layer 10 disposed on the metal contact layer 11; an MQW layer 9 disposed on the p type cladding layer 10; an n type cladding layer 8 disposed on the MQW layer 9; and a window layer 7 disposed on the n type cladding layer 8.

In the structure of FIG. 7, the metal layer 12 is formed of, for example, an Au layer. Moreover, the metal contact layer 11 is formed, for example of the AuBe layer or the alloy layer of AuBe and Ni. The p type cladding layer 10 is formed of an AlGaAs layer or a multilayer structure of an AlGaAs layer having the conductivity type as p⁻ and an AlGaAs layer having the conductivity type as p⁺ type, for example, and the thickness is about 0.1 μm, for example. The MQW layer 9 is composed of MQW structure which laminates about 100 pairs of heterojunction pairs composed of a GaAs/GaAlAs layer, for example, and the thickness is formed in about 1.6 μm, for example. The n type cladding layer 8 is formed, for example of an n type AlGaAs layer, and the thickness is about 0.1 μm, for example. The window layer 7 is composed, for example of a multilayer structure of an AlGaAs layer, and a GaAs layer formed on the multilayer structure of the AlGaAs layer, and the whole thickness is about 0.95 μm.

As shown in FIG. 8, a semiconductor light emitting device according to the first embodiment is formed by bonding mutually the p type or n type GaAs substrate shown in FIG. 5 to FIG. 6 and the LED structure shown in FIG. 7 by the wafer bonding technology.

That is, as shown in FIG. 8, the semiconductor light emitting device according to the first embodiment includes: a p (n) type GaAs substrate structure including a p (n) type GaAs layer 3 (6) forming a plurality of trench regions on the surface, a metal buffer layer 2 disposed on the surface of the p (n) type GaAs layer 3 (6), the sidewall of the trench region, and the bottom surface of the trench region, a metal layer 1 disposed on the metal buffer layer 2, a metal buffer layer 4 disposed on the back side of the p (n) type GaAs layer 3 (6), and a metal layer 5 disposed on the surface of the metal buffer layer 4 (6) on the side opposite to the p (n) type GaAs layer 3; and an LED structure disposed on the aforementioned p (n) type GaAs substrate and including a metal layer 12, a metal contact layer 11 disposed on the metal layer 12, a p type cladding layer 10 disposed on the metal contact layer 11, an MQW layer 9 disposed on the p type cladding layer 10; an n type cladding layer 8 disposed on the MQW layer 9; and a window layer 7 disposed on the n type cladding layer 8.

The p (n) type GaAs substrate structure and the LED structure composed of epitaxial growth layers are bonded using the metal layer 1 and the metal layer 12 disposed on the surface of the p (n) type GaAs layer 3 (6), and the air gap 40 exists between the first metal layer 1 of the trench region, and the metal layer 12. Accordingly, the adhesion of the metal layer 1 and the metal layer 12 disposed on the surface of the p (n) type GaAs layer 3 (6) can be kept satisfactory, a barrier metal becomes unnecessary, and the metallic reflecting layer with a sufficient reflection factor can be formed. Therefore, there is also no problem of Sn diffusion from Au—Sn alloy layer.

The metallic reflecting layer is beforehand formed of the metal layer 12 disposed at the LED structure side. Since a mirror surface is formed of the interface between the p type cladding layer 10 and the metal layer 12, the radiated light from the LED is reflected from the aforementioned mirror surface. Although the metal contact layer 11 is a layer for achieving the ohmic contact of the metal layer 12 and the p type cladding layer 10, the metal contact layer 11 is intervened to the interface between the metal layer 12 and the p type cladding layer 10, and forms a part of the mirror surface.

As shown in FIG. 8, as for the semiconductor light emitting device according to the first embodiment, the metal layer 1 at the side of the GaAs substrate and the metal layer 12 at the side of the LED structure composed of the epitaxial growth layer can be bonded by thermocompression bonding by forming both the metal layer 1 and the metal layer 12 with the Au layer.

The conditions of wafer bonding are about 250 degrees C. to 700 degrees C., for example, and are 300 degrees C. to 400 degrees C. preferable, and the pressure of thermocompression bonding is about 10 MPa to 20 MPa, for example. By providing the air gap 40, the contact area of the metal layer 1 and the metal layer 12 is decreasing as compared with a structure of bonding the whole surface. As a result, the pressure of the above-mentioned thermocompression bonding is pressurized by the contact area of the metal layer 1 and the metal layer 12 to which the contact area reduced relatively by providing the air gap 40, and the bonding strength becomes high at the time of thermocompression bonding of the metal layer 1 and the metal layer 12. Therefore, when bonding the p (n) type GaAs substrate structure and the LED structure composed of epitaxial growth layers, the adhesion of the metal layer 1 and the metal layer 12 disposed on the surface of the p (n) type GaAs layer 3 (6) can be kept satisfactory by providing the air gap 40.

According to the semiconductor light emitting device according to the first embodiment, the high brightness of LED can be achieved since the metallic reflecting layer of effective optical reflection factor can be formed on the structure at the side of the LED by using the metal layer 12 composed of Au, keeping satisfactory the adhesion of the metal layer 1 and the metal layer 12.

Second Embodiment

Element Structure

Figure 9:
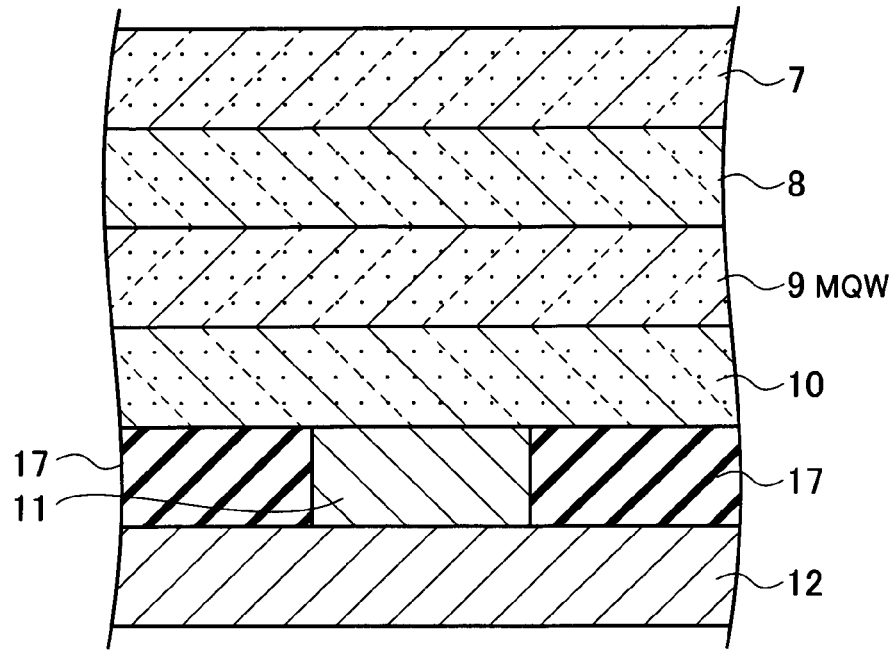
FIG. 9 It is a schematic cross-sectional configuration chart of an LED applied to a semiconductor light emitting device and a fabrication method for such semiconductor light emitting device according to a second embodiment of the present invention.

As shown in FIG. 9, an LED applied to a semiconductor light emitting device according to a second embodiment and a fabrication method for such semiconductor light emitting device includes: a metal layer 12; a patterned metal contact layer 11 and a patterned insulating layer 17 disposed on the metal layer 12; a p type cladding layer 10 disposed on the patterned metal contact layer 11 and patterned insulating layer 17; an MQW layer 9 disposed on the p type cladding layer 10; an n type cladding layer 8 disposed on the MQW layer 9; and a window layer 7 disposed on the n type cladding layer 8.

In the structure of FIG. 9, the metal layer 12 is formed, for example of an Au layer, and the thickness is about 2.5 to 5 µm, for example. Moreover, the metal contact layer 11 is formed, for example of an AuBe layer or an alloy layer of AuBe and Ni, for example. The thickness is the same grade as the insulating layer 17, and is about 450 nm. The insulating layer 17 is formed, for example of a silicon dioxide film, a silicon nitride film, a SiON film, $SiO_xNy$ film, or these multilayer films. The p type cladding layer 10 is formed of an AlGaAs layer or a multilayer structure of an AlGaAs layer having the conductivity type as p⁻ type and an AlGaAs layer having the conductivity type as p⁺ type, for example, and the thickness is about 0.1 µm, for example. The MQW layer 9 is composed of an MQW (multi-quantum well) structure which laminates about 100 pairs of hetero junction pairs composed of a GaAs/GaAlAs layer, for example, and the thickness is formed in about 1.6 µm, for example. The n type cladding layer 8 is formed, for example of an n type AlGaAs layer, and the thickness is about 0.1 µm, for example. The window layer 7 is composed, for example of a multilayer structure of an AlGaAs layer, and a GaAs layer formed on the multilayer structure of the AlGaAs layer, and the whole thickness is about 0.95 µm.

Modified Example of Second Embodiment

Figure 10:
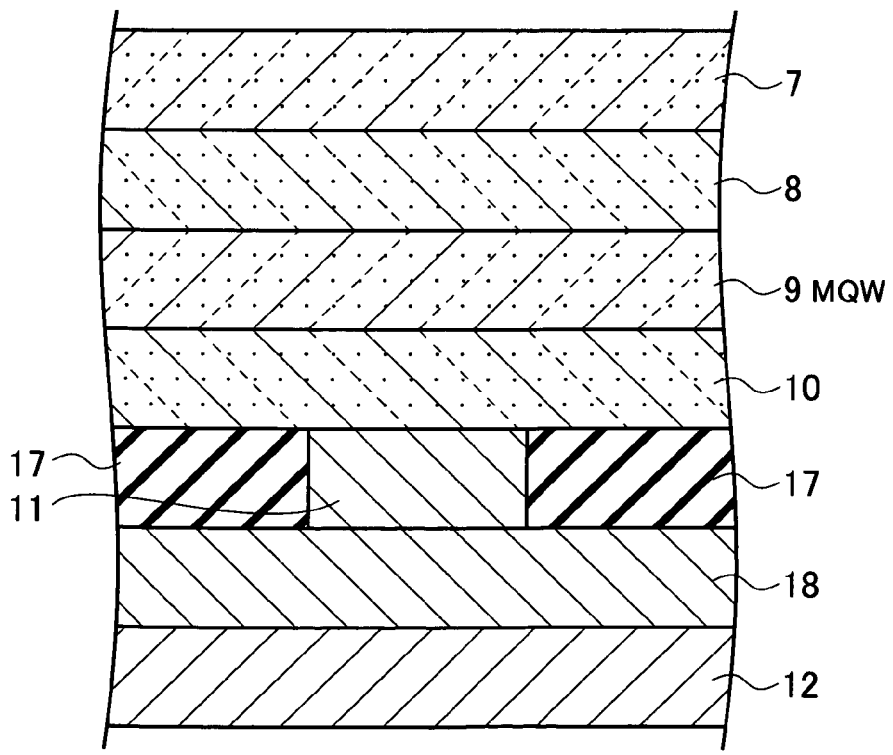
FIG. 10 It is a schematic cross-sectional configuration chart of an LED applied to a semiconductor light emitting device and a fabrication method for such semiconductor light emitting device according to a modified example of the second embodiment of the present invention.

As shown in FIG. 10, an LED applied to a semiconductor light emitting device according to a modified example of the second embodiment and a fabrication method for such semiconductor light emitting device includes: a metal layer 12; a metal buffer layer 18 disposed on the metal layer 12; a patterned metal contact layer 11 and a patterned insulating layer 17 disposed on the metal buffer layer 18; a p type cladding layer 10 disposed on the patterned metal contact layer 11 and patterned insulating layer 17; an MQW layer 9 disposed on the p type cladding layer 10; an n type cladding layer 8 disposed on the MOW layer 9; and a window layer 7 disposed on the n type cladding layer 8.

In the structure of FIG. 10, the metal buffer layer 18 is formed, for example of Ag, Al, Ni, Cr, or W layer. Since blue light and ultraviolet light are absorbed in the metal layer 12 composed of Au layer, it is preferable to provide the metal buffer layer 18 composed of Ag, Al, etc. in order to reflect the light at the side of such short wavelength. In the structure of FIG. 10, since each layers except the metal buffer layer 18 are formed as well as the structure of FIG. 9, the explanation is omitted.

Figure 11:
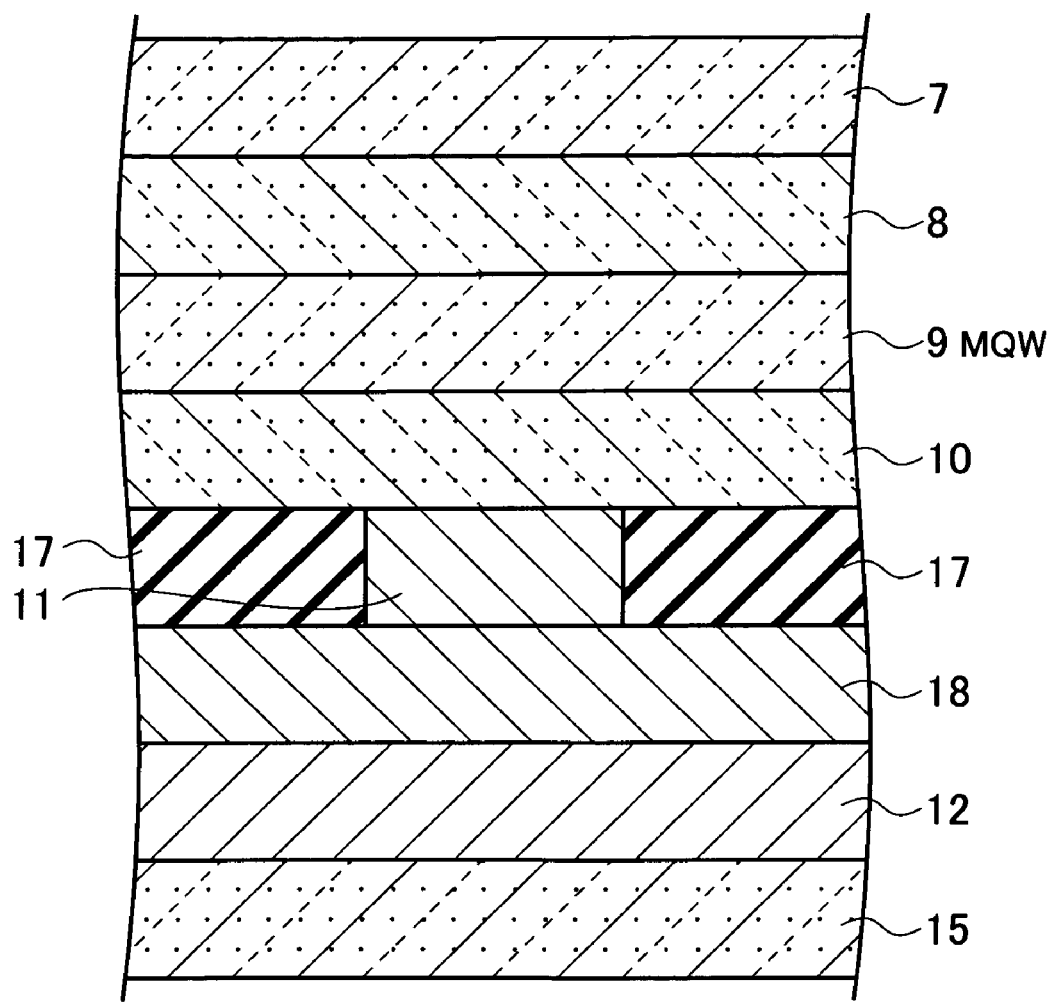
FIG. 11 It is a schematic cross-sectional configuration chart of the semiconductor light emitting device according to the second embodiment of the present invention.

As shown in FIG. 11, the semiconductor light emitting device according to the second embodiment is formed by bonding mutually the LED structure and the GaAs substrate 15 shown in FIG. 9 to FIG. 10 by the wafer bonding technology.

FIG. 11 shows a schematic cross-section structure of the semiconductor light emitting device according to the modified example of the second embodiment formed by bonding mutually the p type or n type GaAs substrate 15 and the LED shown in FIG. 10 by the wafer bonding technology. In addition, in FIG. 11, the metal layer which is composed of Au layers for example, and is disposed on the GaAs substrate 15 is omitted in the illustration. Alternatively, it is also possible to bond the GaAs substrate and the LED structure only by the metal layer 12, without disposing metal layers, such as an Au layer, on the GaAs substrate 15.

That is, as shown in FIG. 11, the semiconductor light emitting device according to the modified example of the second embodiment includes: a GaAs substrate 15; and an LED structure including a metal layer 12 disposed on the GaAs substrate 15, a metal buffer layer 18 disposed on the metal layer 12, a patterned metal contact layer 11 and a patterned insulating layer 17 disposed on the metal buffer layer 18, a p type cladding layer 10 disposed on the patterned metal contact layer 11 and patterned insulating layer 17, an MQW layer 9 disposed on the p type cladding layer 10, an n type cladding layer 8 disposed on the MQW layer 9, and a window layer 7 disposed on the n type cladding layer 8.

It is possible to form the metallic reflecting layer with a sufficient reflection factor by bonding the GaAs substrate 15 and the LED structure composed of the epitaxial growth layer by using the metal layer 12. The metallic reflecting layer is beforehand formed of the metal layer 12 disposed at the LED structure side. Since a mirror surface is formed of the interface between the insulating layer 17, and the metal layer 12 or the metal buffer layer 18, the radiated light from the LED is reflected at the aforementioned mirror surface. Although the metal contact layer 11 is a layer for achieving the ohmic contact of the metal layer 12 or the metal buffer layer 18, and the p type cladding layer 10, the metal contact layer 11 is intervened to the interface between the metal layer 12 and the p type cladding layer 10, and has the thickness of the same grade as the insulating layer 17.

Since a substantial light emitting region is limited when the pattern width of the metal contact layer 11 is wide, the area efficiency reduces and the light emitting efficiency decreases. On the other hand, since the sheet resistivity of the metal contact layer 11 increases and the forward voltage Vf of the LED rises when the pattern width of the metal contact layer 11 is narrow, there is the optimal pattern width and pattern structure. In some examples of a pattern, there is a honeycomb pattern structure based on a hexagon or a dotted pattern structure based on a round shape. Such pattern shape will be explained in relation to a fourth embodiment, referring to FIG. 17 and FIG. 18.

As for the semiconductor light emitting device according to the second embodiment and its modified example, the metal layer (not shown) at the side of the GaAs substrate and the metal layer 12 at the side of the LED structure composed of the epitaxial growth layer can be bonded by thermocompression bonding by forming both the metal layer disposed on a GaAs substrate, and the metal layer 12 disposed at the LED side by the Au layer as well as the first embodiment shown in FIG. 8.

The conditions of wafer bonding are about 250 degrees C. to 700 degrees C., for example, and are 300 degrees C. to 400 degrees C. preferable, and the pressure of thermocompression bonding is about 10 MPa to 20 MPa, for example.

According to the semiconductor light emitting device according to the second embodiment and its modified example, the contact between the semiconductor layer, such as the p type cladding layer 10, and the metal layer 12 can be avoided, the optical absorption can be prevented, and the metallic reflecting layer having a sufficient reflection factor can be formed, by forming the transparent insulating layer 17 between the metal layer 12 or the metal buffer layer 18 acting as a metallic reflecting layer, and the semiconductor layers, such as the p type cladding layer 10.

In order to perform patterning formation of the transparent insulating layer 17 and to achieve ohmic contact, the metal contact layer 11 composed of AuBe etc. is vapor-deposited by lift off.

Then, the Au layer used for bonding with the GaAs substrate 15 on the insulating layer 17 is vapor-deposited, and the metal layer 12 is formed.

According to the semiconductor light emitting device according to the second embodiment and its modified example, the high brightness of LED can be achieved since the contact the semiconductor layers, such as the p type cladding layer 10, with the metal layer 12 can be avoided, the optical absorption can be prevented, and the metallic reflecting layer having the sufficient reflection factor can be formed, by intervening the transparent insulating layer 17 between the metallic reflecting layer and the semiconductor layer.

Moreover, according to the semiconductor light emitting device according to the second embodiment and its modified example, the light of short wavelength, such as ultraviolet rays having a low reflection factor, can be efficiently reflected at Au, and the high brightness of the LED can be achieved, by forming the metal buffer layer 18 composed of Ag, Al, etc. between the insulating layer 17 and the metal layer 12.

Moreover, according to the semiconductor light emitting device according to the second embodiment and its modified example, since the light is not absorbed in the interface between the p type cladding layer and the metallic reflecting layer, the high brightness of LED can be achieved.

Third Embodiment

Element Structure

Figure 12:
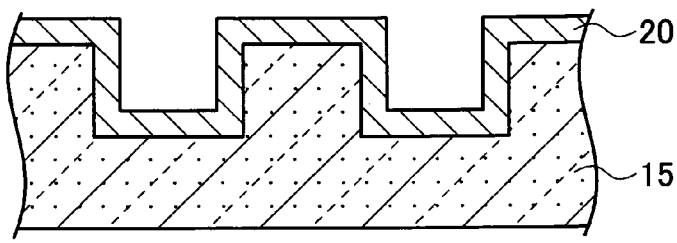
FIG. 12 It is a schematic cross-sectional configuration chart of a GaAs substrate applied to a semiconductor light emitting device and a fabrication method for such semiconductor light emitting device according to a third embodiment of the present invention.

As shown in FIG. 12, a p type or n type GaAs substrate structure applied to a semiconductor light emitting device according to a third embodiment and a fabrication method for such semiconductor light emitting device includes: a GaAs substrate 15 forming a plurality of trench regions on a surface; and a metal layer 20 disposed on a surface of the GaAs substrate 15, at a sidewall of the trench region, and on a bottom surface of the trench region.

In the structure of FIG. 12, the metal layer 20 is formed, for example of an Au layer.

Figure 13:
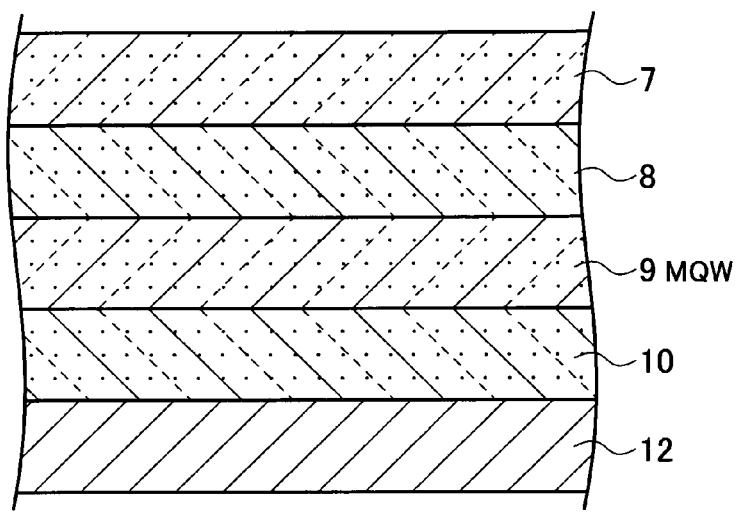
FIG. 13 It is a schematic cross-sectional configuration chart of an LED applied to the semiconductor light emitting device and the fabrication method for such semiconductor light emitting device according to the third embodiment of the present invention.

As shown in FIG. 13, a schematic cross-section structure of LED applied to the semiconductor light emitting device according to the third embodiment and the fabrication method for such semiconductor light emitting device includes: a metal layer 12; a p type cladding layer 10 disposed on the metal layer 12; an MQW layer 9 disposed on the p type cladding layer 10; an n type cladding layer 8 disposed on the MQW layer 9; and a window layer 7 disposed on the n type cladding layer 8.

In the structure of FIG. 13, the metal layer 12 is formed, for example of an Au layer, and the thickness is about 1 μm. Moreover, the p type cladding layer 10 is formed of an AlGaAs layer or a multilayer structure of an AlGaAs layer having the conductivity type as p− type and the AlGaAs layer having the conductivity type as p+ type, for example, and the whole thickness is about 0.1 μm, for example. The MQW layer 9 is composed of an MQW (Multi-Quantum Well) structure which laminates about 80 to 100 pairs of heterojunction pairs composed of a GaAs/GaAlAs layer, for example, and the whole thickness is about 1.6 μm, for example. The n type cladding layer 8 is formed, for example of an n type AlGaAs layer, and the thickness is about 0.1 μm, for example. The window layer 7 is composed, for example of a multilayer structure of an AlGaAs layer, and a GaAs layer formed on the multilayer structure of the AlGaAs layer, and the whole thickness is about 0.95 μm.

Figure 14:
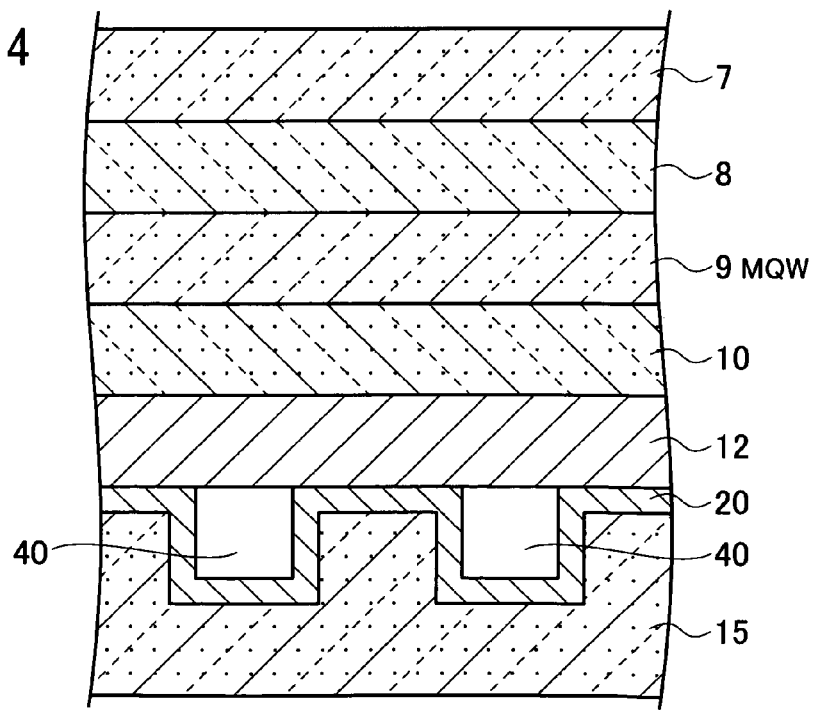
FIG. 14 It is a schematic cross-sectional configuration chart of the semiconductor light emitting device according to the third embodiment of the present invention.

As shown in FIG. 14, the semiconductor light emitting device according to the third embodiment is formed by bonding mutually the LED structure shown in FIG. 13 with the p type or n type GaAs substrate shown in FIG. 12 by the wafer bonding technology. There is an air gap 40 between the metal layer 20 of the trench region, and the metal layer 12.

That is, as shown in FIG. 14, the semiconductor light emitting device according to the third embodiment includes: a GaAs substrate structure including a GaAs substrate 15 forming a plurality of trench regions on a surface, and a metal layer 20 disposed on the surface of the GaAs substrate 15, at a sidewall of the trench region, and on a bottom surface of the trench region; and an LED structure disposed on the aforementioned GaAs substrate structure and including a metal layer 12, a p type cladding layer 10 disposed on the metal layer 12, an MQW layer 9 disposed on the p type cladding layer 10, an n type cladding layer 8 disposed on the MQW layer 9, and a window layer 7 disposed on the n type cladding layer 8. The air gap 40 formed in the trench region of stripe shape formed on the surface of the GaAs substrate is included in the completed chip. If the pitch L is large, the air gap 40 may not be included in the completed chip.

The metallic reflecting layer is beforehand formed of the metal layer 12 disposed at the LED structure side. Since a mirror surface is formed of the interface between the p type cladding layer 10 and the metal layer 12, the radiated light from the LED is reflected in the aforementioned mirror surface.

As shown in FIG. 14, as for the semiconductor light emitting device according to the third embodiment, the metal layer 20 at the side of the GaAs substrate and the metal layer 12 at the side of the LED structure composed of the epitaxial growth layer can be bonded by thermocompression bonding by forming both the metal layer 20 and the metal layer 12 with the Au layer. The air gap 40 is provided between the metal layer 20 of the trench region, and the metal layer 12. Accordingly, the adhesion of the metal layer 20 and the metal layer 12 disposed on the surface of the GaAs layer 15 can be kept satisfactory, a barrier metal becomes unnecessary, and the metallic reflecting layer with a sufficient reflection factor can be formed.

The conditions of wafer bonding are about 250 degrees C. to 700 degrees C., for example, and are 300 degrees C. to 400 degrees C. preferable, and the pressure of thermocompression bonding is about 10 MPa to 20 MPa, for example. The contact area of the metal layer 20 and the metal layer 12 is decreasing as compared with a structure of bonding the whole surface, by providing the air gap 40. As a result, the pressure of the above-mentioned thermocompression bonding is pressurized by the contact area of the metal layer 20 and the metal layer 12 to which the contact area reduced relatively by providing the air gap 40, and the bonding strength becomes high at the time of thermocompression bonding of the metal layer 20 and the metal layer 12. Therefore, when bonding the GaAs substrate structure and the LED structure composed of epitaxial growth layers, the adhesion of the metal layer 20 and the metal layer 12 disposed on the surface of the GaAs layer 15 can be kept satisfactory by providing the air gap 40.

According to the semiconductor light emitting device and the fabrication method for such semiconductor light emitting device according to the third embodiment, the total reflection of the light can be preformed by using the metal for the reflecting layer in order to prevent the optical absorption to the GaAs substrate, and the absorption to the GaAs substrate can be prevented. As a material of the semiconductor substrate to bond, non-transparent semiconductor substrate materials, such as GaAs and Si, are used.

Using an Au layer as the metal layer 20 at the side of GaAs substrate 15, using an Au layer also as the metal layer 12 at the side of LED provided with an epitaxial growth layer, the metal layer 20 and the metal layer 12 are bonded, and the metal layer 12 used for bonding is applied to the optical reflecting layer as the metallic reflecting layer.

According to the semiconductor light emitting device and the fabrication method for such semiconductor light emitting device according to the third embodiment, the high brightness of the LED can be performed since it is possible to perform total reflection of the light by using the metal for the reflecting layer, to prevent the absorption in the GaAs substrate, and to reflect the light of all angles, in order to prevent the optical absorption in the GaAs substrate.

Fourth Embodiment

Element Structure

Figure 15:
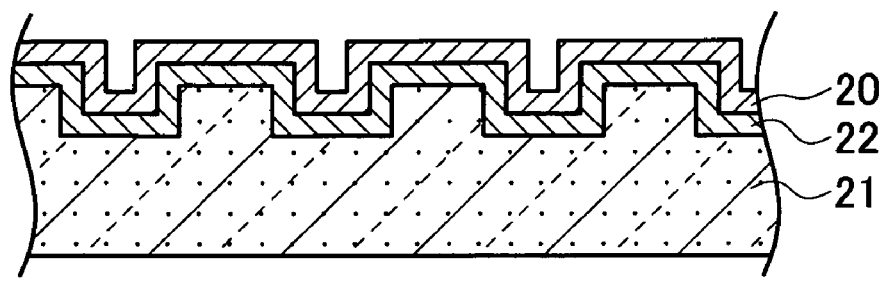
FIG. 15 It is a schematic cross-sectional configuration chart of an Si substrate applied to a semiconductor light emitting device and a fabrication method for such semiconductor light emitting device according to a fourth embodiment of the present invention.

As shown in FIG. 15, a silicon substrate structure applied to a semiconductor light emitting device according to a fourth embodiment and a fabrication method for such semiconductor light emitting device includes: a silicon substrate 21 forming a plurality of trench regions on a surface; a titanium (Ti) layer 22 disposed on the surface of the silicon substrate 21, at a sidewall of the trench region, and on a bottom surface of the trench region; and a metal layer 20 disposed on the surface of the titanium (Ti) layer 22, the sidewall of the trench region, and the bottom surface of the trench region.

In the structure of FIG. 15, the thickness of the silicon substrate 21 is about 130 μm, for example. The metal layer 20 is formed, for example of an Au layer, and the thickness is about 2.5 μm.

Figure 16:
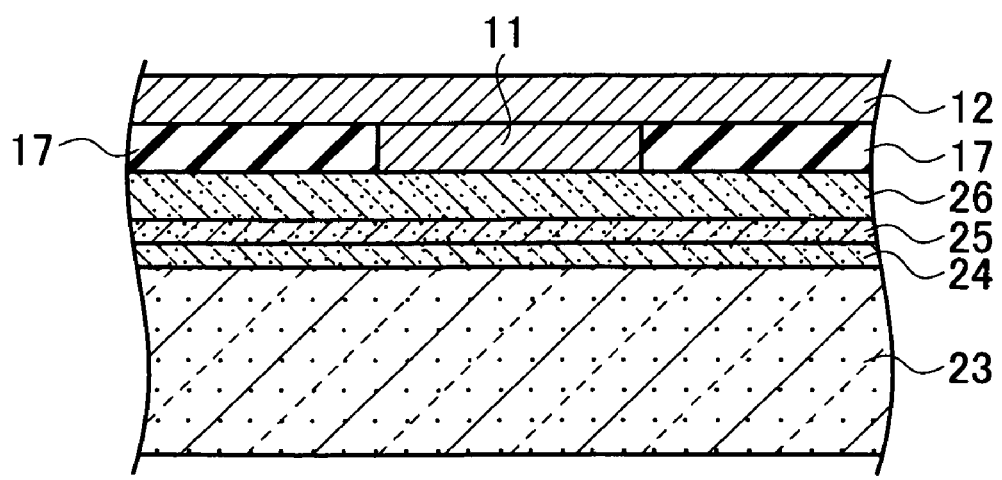
FIG. 16 It is a schematic cross-sectional configuration chart of an LED applied to the semiconductor light emitting device and the fabrication method for such semiconductor light emitting device according to the fourth embodiment of the present invention.

As shown in FIG. 16, an LED applied to the semiconductor light emitting device according to the fourth embodiment and the fabrication method for such semiconductor light emitting device includes: a GaAs substrate 23; an AlInGaP layer 24 disposed on the GaAs substrate 23; an n type GaAs layer 25 disposed on the AlInGaP layer 24; an epitaxial growth layer 26 disposed on the n type GaAs layer 25; a metal contact layer 11 and an insulating layer 17 disposed on the epitaxial growth layer 26 and patterned; and a metal layer 12 disposed on the patterned metal contact layer 11 and patterned insulating layer 17.

In the structure of FIG. 16, the thickness of the GaAs substrate 23 is about 300 μm, for example, and the thickness of the AlInGaP layer 24 is about 350 nm, for example. Moreover, the n type GaAs layer 25 functions as a contact layer between the GaAs substrate 23 and the epitaxial growth layer 26 via the AlInGaP layer 24, and the thickness is about 500 nm, for example. The epitaxial growth layer 26 includes: an n type window layer and n type cladding layer composed of AlGaAs layer; an MQW layer composed of a plurality of pairs of the heterojunction of GaAs/AlGaAs; and an n type cladding layer composed of AlGaAs layer, and a p type window layer composed of AlGaAs layer/GaP layer. The MQW layer is composed of an MQW (multi-quantum well) structure which laminates about 100 pairs of heterojunction pairs composed of a GaAs/GaAlAs layer, for example, and the thickness is formed in about 1.6 μm, for example.

Moreover, the metal contact layer 11 is formed, for example of an AuBe layer or an alloy layer of AuBe and Ni, for example. The thickness is the same grade as the insulating layer 17, and is about 450 nm.

The metal contact layer 11 may be formed, for example as layered structure, such as an Au/AuBe—Ni alloy/Au. The insulating layer 17 is formed, for example of a silicon dioxide film, a silicon nitride film, a SiON film, $SiO_xN_y$ film, or these multilayer films.

The metal layer 12 is formed, for example of an Au layer, and the thickness is about 2.5 to 5 μm, for example. The p type cladding layer in the epitaxial growth layer 26 is formed of an AlGaAs layer or a multilayer structure of an AlGaAs layer having the conductivity type as $p^-$ type and an AlGaAs layer having the conductivity type as $p^+$ type, for example, and the thickness is about 0.1 μm, for example. The n type cladding layer in the epitaxial growth layer 26 is formed, for example of a n type AlGaAs layer, and the thickness is about 0.1 μm, for example. The n type window layer is composed, for example of a multilayer structure of an AlGaAs layer and a GaAs layer formed on the multilayer structure of the AlGaAs layer, and the whole thickness is about 0.95 μm, for example. The p type window layer is composed, for example of a multilayer structure of an AlGaAs layer and a GaP layer formed on the multilayer structure of the AlGaAs layer, and the whole thickness is about 0.32 μm, for example.

The semiconductor light emitting device according to the fourth embodiment is formed by bonding mutually the silicon substrate structure shown in FIG. 15, and the LED structure shown in FIG. 16 by the wafer bonding technology, as shown in FIG. 19 to FIG. 24. There is an air gap 40 between the metal layer 20 of the trench region, and the metal layer 12.

Figure 24:
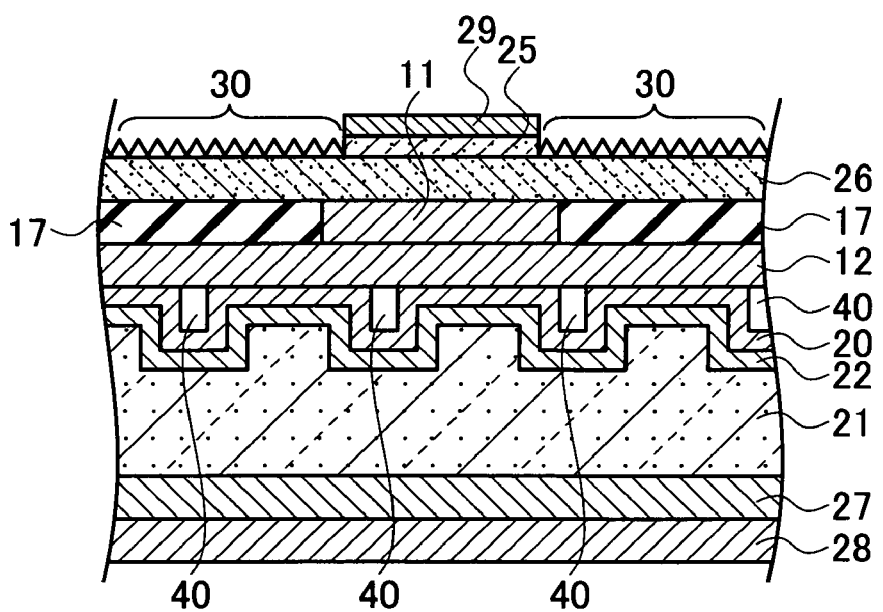
FIG. 24 It is a schematic cross-sectional configuration chart explaining one process of the fabrication method of the semiconductor light emitting device according to the fourth embodiment of the present invention.

That is, as shown in FIG. 24, the semiconductor light emitting device according to the fourth embodiment includes: a silicon substrate structure including a silicon substrate 21 forming a plurality of trench regions on a surface, a titanium (Ti) layer 22 disposed on the surface of the silicon substrate 21, at a sidewall of the trench region, and on a bottom surface of the trench region, a metal layer 20 disposed on the surface of the titanium (Ti) layer 22, the sidewall of the trench region, and the bottom surface of the trench region; and an LED structure including a metal layer 12 disposed on the metal layer 20; a patterned metal contact layer 11 and a patterned insulating layer 17 disposed on the metal layer 12, an epitaxial growth layer 26 disposed on the patterned metal contact layer 11 and the patterned insulating layer 17 and having a frosting processing region 30 (region formed by performing frosting processing of the exposed n type GaAs layer 25) on the exposed surface, a patterned n type GaAs layer 25 disposed on the epitaxial growth layer 26, and a similarly patterned surface electrode layer 29 disposed on the n type GaAs layer 25. The air gap 40 formed in the trench region of the stripe shape formed on the surface of the silicon substrate 21 is included in the completed chip. If the pitch L is large, the air gap 40 may not be included in the completed chip.

In addition, in the silicon substrate structure, a titanium layer 27 and a back surface electrode layer 28 are disposed at the back side of the silicon substrate 21.

Figure 26:
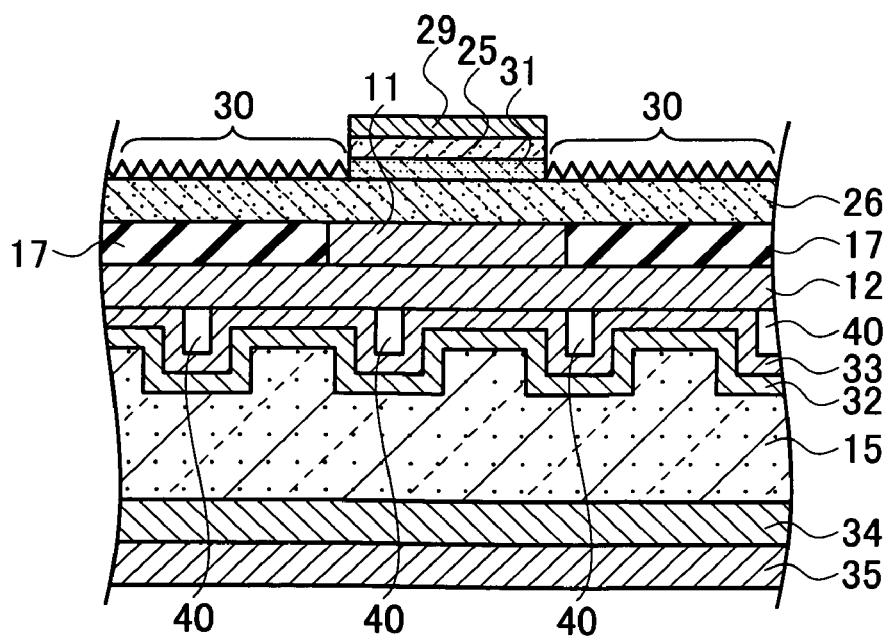
FIG. 26 It is a schematic cross-sectional configuration chart for explaining one process of a fabrication method of a semiconductor light emitting device according to another modified example of the fourth embodiment of the present invention.

Moreover, a blocking layer 31 for preventing current concentration may be disposed between the epitaxial growth layer 26 and the n type GaAs layer 25, as shown in FIG. 26 described later. As a material of the blocking layer 31 in this case, GaAs can be applied and the thickness is about 500 nm, for example.

Also in the semiconductor light emitting device according to the fourth embodiment, as shown in FIG. 24, it is possible to form a metallic reflecting layer having a sufficient reflection factor by bonding the silicon substrate structure and the LED structure composed of the epitaxial growth layer by using the metal layer 12. The metallic reflecting layer is beforehand formed of the metal layer 12 disposed at the LED structure side. Since a mirror surface is formed of the interface between the insulating layer 17 and the metal layer 12, the radiated light from the LED is reflected from the aforementioned mirror surface. Although the metal contact layer 11 is a layer for achieving the ohmic contact of the metal layer 12 and the epitaxial growth layer 26, the metal contact layer 11 is intervened to between the interfaces of the metal layer 12 and the epitaxial growth layer 26, and has the thickness of the same grade as the insulating layer 17.

As shown in FIG. 19 to FIG. 24, the semiconductor light emitting device according to the fourth embodiment can bond the metal layer 20 at the side of the silicon substrate and the metal layer 12 at the side of the LED structure composed of the epitaxial growth layer by thermocompression bonding by forming both the metal layer 20 and the metal layer 12 with the Au layer. The air gap 40 is provided between the metal layer 20 of the trench region, and the metal layer 12. Accordingly, the adhesion of the metal layer 20 and the metal layer 12 disposed on the surface of the silicon substrate 21 can be kept satisfactory, a barrier metal becomes unnecessary, and the metallic reflecting layer with a sufficient reflection factor can be formed.

The conditions of wafer bonding are about 250 degrees C. to 700 degrees C., for example, and are 300 degrees C. to 400 degrees C. preferable, and the pressure of thermocompression bonding is about 10 MPa to 20 MPa, for example. The contact area of the metal layer 20 and the metal layer 12 is decreasing as compared with a structure of bonding the whole surface, by providing the air gap 40. As a result, the pressure of the above-mentioned thermocompression bonding is pressurized by the contact area of the metal layer 20 and the metal layer 12 to which the contact area reduced relatively by providing the air gap 40, and the bonding strength becomes high at the time of thermocompression bonding of the metal layer 20 and the metal layer 12. Therefore, when bonding the silicon substrate structure and the LED structure composed of epitaxial growth layers, the adhesion of the metal layer 20 and the metal layer 12 disposed on the surface of the silicon substrate 21 can be kept satisfactory by providing the air gap 40.

(Plane Pattern Structure)

Since a substantial light emitting region is limited when the pattern width of the metal contact layer 11 is wide, the area efficiency reduces and the light emitting efficiency decreases. On the other hand, when the pattern width of the metal contact layer 11 is narrow, the sheet resistivity of the metal contact layer 11 increases and the forward voltage Vf of LED rises. Accordingly, there are the optimal pattern width W and the pattern pitch D1. In some examples of the pattern, there is a honeycomb pattern structure based on a hexagon or a circular dotted pattern structure based on a circular dotted shape basic structure.

Figure 17:
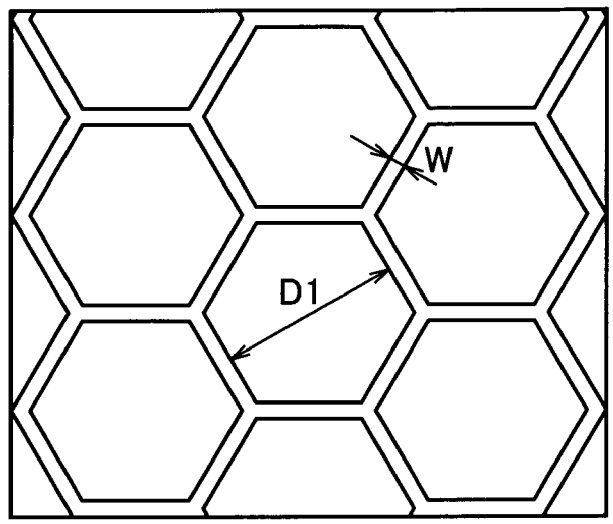
FIG. 17 It is a schematic plane pattern structural drawing of the LED applied to the semiconductor light emitting device and the fabrication method for such semiconductor light emitting device according to the fourth embodiment of the present invention.

A schematic plane pattern structure of the LED applied to the semiconductor light emitting device and the fabrication method for such semiconductor light emitting device according to the fourth embodiment has the honeycomb pattern based on a hexagonal basic structure, for example, as shown in FIG. 17. In FIG. 17, the shaped part shown by the width W shows a pattern of the metal contact layer 11 formed, for example of an AuBe layer or an alloy layer of AuBe and Ni in FIG. 16. The hexagonal pattern having the width D1 is equivalent to a part of the insulating layer 17, and expresses a region where the radiated light from LED is guided. The width D1 is about 100 µm, for example, and the line width W is about 5 µm to about 11 µm.

Figure 18:
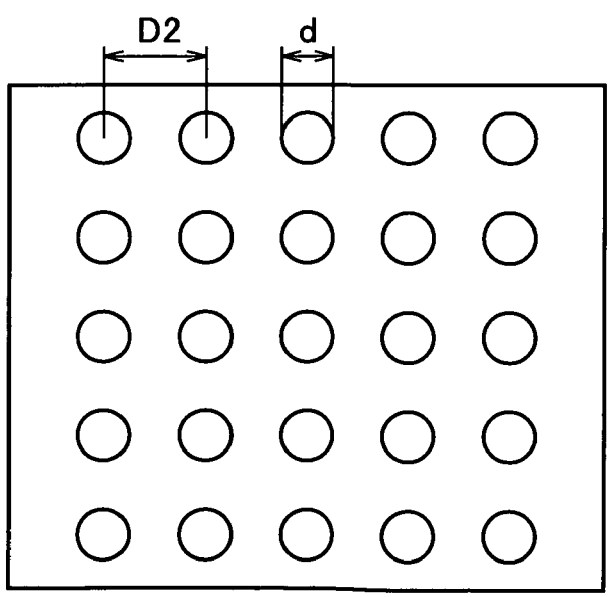
FIG. 18 It is another schematic plane pattern structural drawing of the LED applied to the semiconductor light emitting device and the fabrication method for such semiconductor light emitting device according to the fourth embodiment of the present invention.

Another schematic plane pattern structure of the LED applied to the semiconductor light emitting device and the fabrication method for such semiconductor light emitting device according to the fourth embodiment has a dotted pattern based on a round shape, for example, as shown in FIG. 18. In FIG. 18, the shaped part shown by the width d shows a pattern of the metal contact layer 11 formed of an AuBe layer or an alloy layer of AuBe and Ni in FIG. 16, and is disposed by the pattern pitch having the width D2. In FIG. 18, the region except the circular pattern part having the width d and the pattern pitch D2 is equivalent to a part of the insulating layer 17, and expresses a region where the radiated light from LED is guided. The pattern pitch D2 is about 100 µm, for example, and the width d is about 5 µm to about 11 µm.

Moreover, the schematic plane pattern structure of the LED applied to the semiconductor light emitting device the fabrication method for such semiconductor light emitting device according to the fourth embodiment and is not limited to the hexagonal honeycomb pattern and the circular dotted pattern, but is also applicable to a random pattern for disposing a triangular pattern, a rectangular pattern, a hexagonal pattern, an octagonal pattern, a circular dotted pattern, etc. at random.

The schematic plane pattern structure of the LED applied to the semiconductor light emitting device according to the fourth embodiment has only to be able to secure the metal wiring pattern width which is a level in which the forward voltage Vf of LED does not rise without reducing the light emitting brightness from the LED securing the size of a light guide region.

(Fabrication Method)

The fabrication method of the semiconductor light emitting device according to the fourth embodiment will be explained hereinafter.

FIG. 15 to FIG. 16 and FIG. 19 to FIG. 24 show a schematic cross-section structure for explaining one process of the fabrication method of the semiconductor light emitting device according to the fourth embodiment.

(a) First of all, the silicon substrate structure for wafer bonding is prepared as shown in FIG. 15, and the LED structure for wafer bonding is prepared as shown in FIG. 16.

In the silicon substrate structure, the titanium (Ti) layer 22 is formed on the surface of the silicon substrate 21 forming a plurality of trench regions on the surface, the sidewall of the trench region, and the bottom surface of the trench region, and the metal layer 20 composed of Au etc. is formed on the surface of the titanium (Ti) layer 22, the sidewall of the trench region, and the bottom surface of the trench region, one after another by using the spattering technique, the vacuum evaporation technique, etc.

In the LED structure, the AlInGaP layer 24 on the GaAs substrate 23, the n type GaAs layer 25, and the epitaxial growth layer 26 are formed one after another by using an MBE (Molecular Beam Epitaxy) method, an MOCVD (Metal Organic Chemical Vapor Deposition) method, etc. Next, the metal contact layer 11 and the metal layer 12 are formed for the patterned insulating layer 17 on the epitaxial growth layer 26 by using a lift off method.

Figure 19:
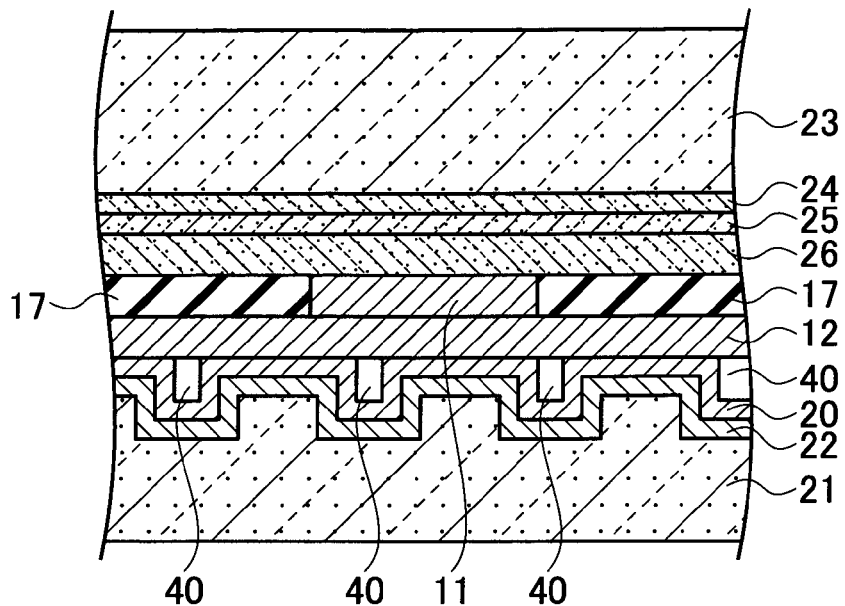
FIG. 19 It is a schematic cross-sectional configuration chart explaining one process of the fabrication method of the semiconductor light emitting device according to the fourth embodiment of the present invention.

(b) Next, as shown in FIG. 19, the silicon substrate structure for wafer bonding shown in FIG. 15, and the LED structure for wafer bonding shown in FIG. 16 are bonded. In the bonding process, it performs on the conditions for about 340 degrees C. as a thermocompression bonding temperature, about 18 MPa as a thermocompression bonding pressure, and about 10 minutes as thermocompression bonding time, by using a pressing machine, for example.

Figure 20:
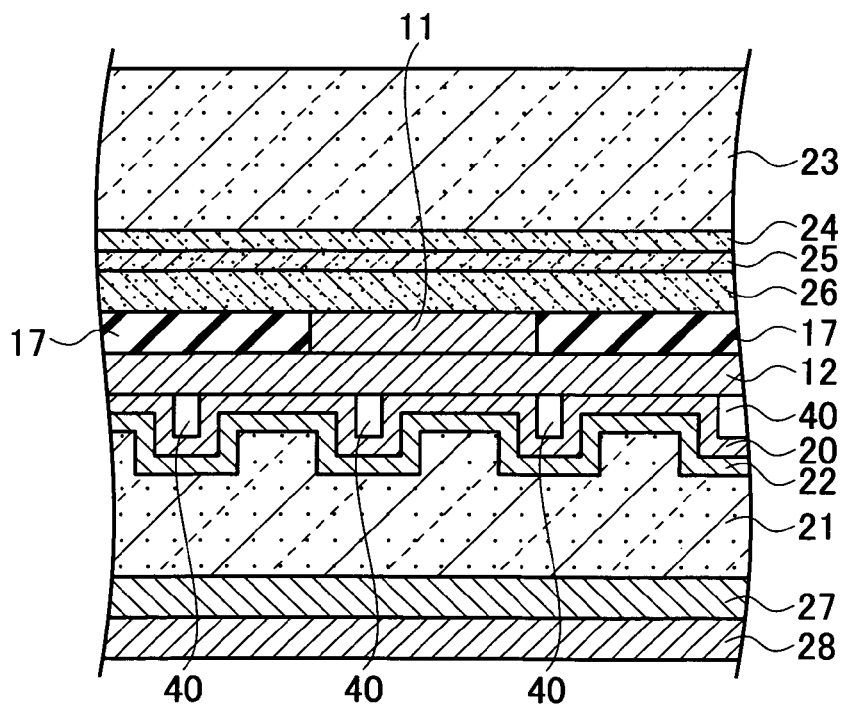
FIG. 20 It is a schematic cross-sectional configuration chart explaining one process of the fabrication method of the semiconductor light emitting device according to the fourth embodiment of the present invention.

(c) Next, as shown in FIG. 20, the titanium layer 27 and the back surface electrode layer 28 composed of Au, etc. are formed for the back side of the silicon substrate 21 one after another using a spattering technique, a vacuum evaporation technique, etc. When not making the titanium layer 27 intervene between the Au layer and the silicon substrate 21, Au of the joined part between the silicon substrate 21 and the Au layer becomes AuSi silicide and the reflection factor is reduced if sintering is performed in order to achieve the ohmic contact. Therefore, the titanium layer 27 has a role of a metal for bonding the silicon substrate 21 with the Au layer of the back surface electrode layer 28. In order to prevent AuSi siliciding of the Au layer, tungsten (W) is needed as a barrier metal, and it is necessary to form a metal layer by silicon substrate/Ti/W/Au from the substrate side as a structure at that time.

Figure 21:
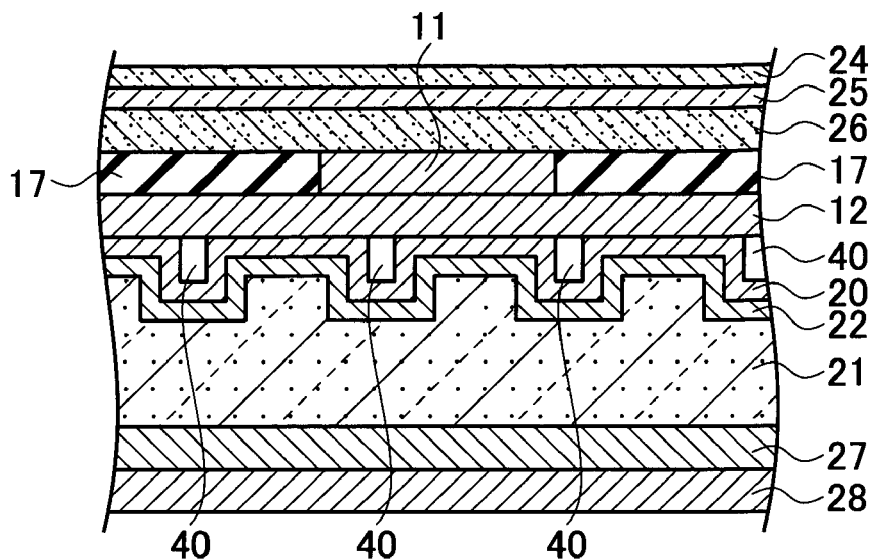
FIG. 21 It is a schematic cross-sectional configuration chart explaining one process of the fabrication method of the semiconductor light emitting device according to the fourth embodiment of the present invention.

(d) Next, as shown in FIG. 21, after protecting the back surface electrode layer 28 by resist etc., the GaAs substrate 23 is removed by etching. The etching time is about 65 to 85 minutes by using the etching solution consisting of ammonia/hydrogen peroxide solution, for example. Here, the AlInGaP layer 24 performs an important function as an etching stopper.

Figure 22:
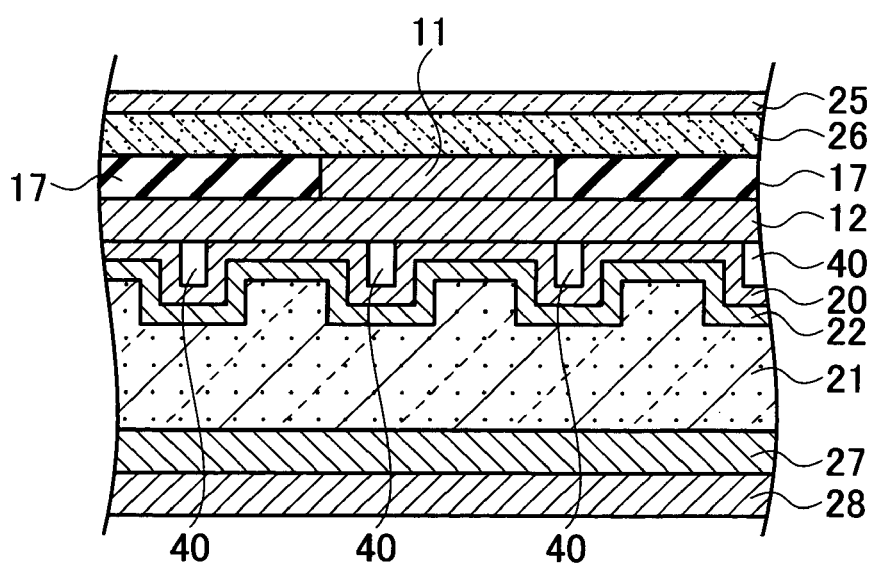
FIG. 22 It is a schematic cross-sectional configuration chart explaining one process of the fabrication method of the semiconductor light emitting device according to the fourth embodiment of the present invention.

(e) Next, as shown in FIG. 22, the AlInGaP layer 24 is removed by using a hydrochloric acid based etching solution. Etching time is an about 1 minute and half, for example.

Figure 23:
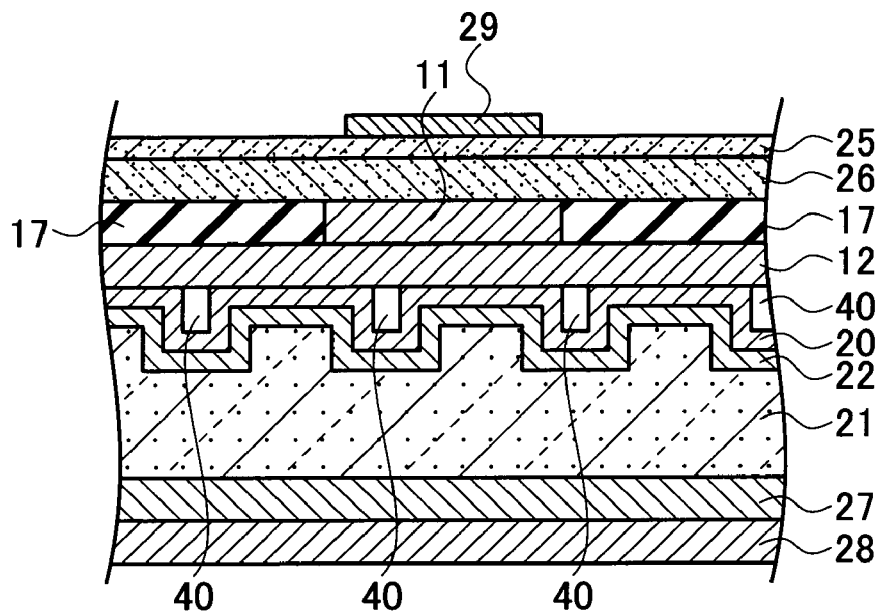
FIG. 23 It is a schematic cross-sectional configuration chart explaining one process of the fabrication method of the semiconductor light emitting device according to the fourth embodiment of the present invention.

(f) Next, as shown in FIG. 23, the surface electrode layer 29 is patterned after formation using a spattering technique, a vacuum evaporation technique, etc. The pattern of the surface electrode layer 29 is substantially agreed with the pattern of the metal contact layer 11. A layered structure composed of Au/AuGe—Ni alloy/Au, for example can be used as a material of the surface electrode layer 29. Here, the n type GaAs layer 25 has a removal preventing function for the surface electrode layer 29.

(g) Next, as shown in FIG. 24, the n type GaAs layers 25 except n type GaAs layer 25 directly under the surface electrode layer 29 is removed by performing frosting processing. As conditions for frosting processing, it can carry out by a nitric acid-sulfuric acid based etching solution of about 30 degrees C. to 50 degrees C. and time periods of about 5 sec to about 15 sec, for example. In addition, the GaO2 film formed on the surface is removable by etching the n type GaAs layer 25 as preprocessing of the frosting processing using the thin liquid of fluoric acid. As the etching time, it is about 3 minutes, for example.

In addition, a tungsten (W) barrier metal, a platinum (Pt) barrier metal, etc. can also be used as an alternative of the titanium layer 22 and the titanium layer 27, for example.

According to the above explanation, as shown in FIG. 24, the semiconductor light emitting device according to the fourth embodiment of the present invention using the silicon substrate 21 is completed.

Modified Example of Fourth Embodiment

Figure 25:
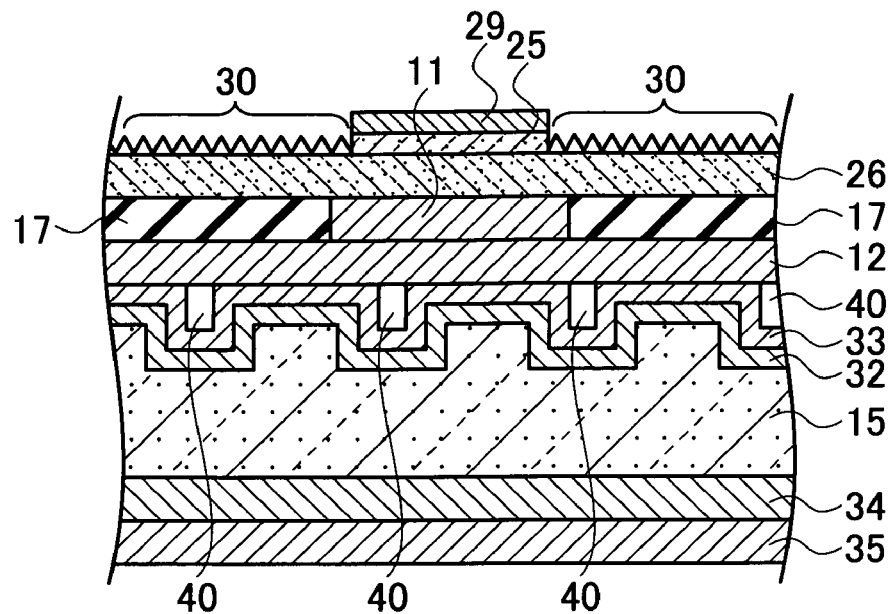
FIG. 25 It is a schematic cross-sectional configuration chart for explaining one process of a fabrication method of a semiconductor light emitting device according to a modified example of the fourth embodiment of the present invention.

A schematic cross-section structure for explaining one process of a fabrication method of a semiconductor light emitting device according to a modified example of the fourth embodiment is expressed as shown in FIG. 25. Moreover, a schematic cross-section structure for explaining one process of a fabrication method of a semiconductor light emitting device according to an alternative modified example of the fourth embodiment is expressed as shown in FIG. 26.

As shown in FIG. 25, the semiconductor light emitting device according to the modified example of the fourth embodiment is formed by bonding mutually the LED structure shown in FIG. 16 with the GaAs substrate structure of having the same structure as FIG. 15 by the wafer bonding technology. There is an air gap 40 between the metal layer 33 of the trench region, and the metal layer 12.

That is, as shown in FIG. 25, the semiconductor light emitting device according to the modified example of the fourth embodiment includes: a GaAs substrate structure including a GaAs substrate 15 forming a plurality of trench regions on a surface, a metal buffer layer (AuGe—Ni alloy layer) 32 disposed on the surface of GaAs substrate 15, at a sidewall of the trench region, and on a bottom surface of the trench region, and a metal layer (Au layer) 33 disposed on the surface of the metal buffer layer 32, on the sidewall of the trench region, and on the bottom surface of the trench region; and an LED structure including a metal layer 12 disposed on the metal layer 33, a patterned metal contact layer 11 and a patterned insulating layer 17 disposed on the metal layer 12, an epitaxial growth layer 26 disposed on the patterned metal contact layer 11 and the patterned insulating layer 17 and having a frosting processing region 30 (region formed by performing frosting processing of the exposed n type GaAs layer 25) on the exposed surface, a patterned n type GaAs layer 25 disposed on the epitaxial growth layer 26, and a similarly patterned surface electrode layer 29 disposed on the n type GaAs layer 25. The air gap 40 formed in the trench region of stripe shape formed on the surface of the GaAs substrate is included in the completed chip. If the pitch L is large, the air gap 40 may not be included in the completed chip.

In addition, in the GaAs substrate structure, a metal buffer layer (AuGe—Ni alloy layer) 34 and a back surface electrode layer 35 are disposed at the back side of the GaAs substrate 15.

Moreover, as shown in FIG. 26, a blocking layer 31 for preventing current concentration may be disposed between the epitaxial growth layer 26 and the n type GaAs layer 25. As a material of the blocking layer 31 in this case, GaAs can be applied and the thickness is about 500 nm, for example.

Also in the semiconductor light emitting device according to the modified example of the fourth embodiment, as shown in FIG. 25, it is possible to form a metallic reflecting layer having a sufficient reflection factor by bonding the GaAs substrate structure and the LED structure composed of epitaxial growth layer, by using the metal layer 12. The metallic reflecting layer is beforehand formed of the metal layer 12 disposed at the LED structure side. Since a mirror surface is formed of the interface between the insulating layer 17 and the metal layer 12, the radiated light from the LED is reflected from the aforementioned mirror surface. Although the metal contact layer 11 is a layer for achieving the ohmic contact of the metal layer 12 and the epitaxial growth layer 26, the metal contact layer 11 is intervened to between the interfaces of the metal layer 12 and the epitaxial growth layer 26, and has the thickness of the same grade as the insulating layer 17.

As shown in FIG. 25 and FIG. 26, the semiconductor light emitting device according to modified example and another modified example of the fourth embodiment can bond the metal layer 33 at the side of the GaAs substrate 15 and the metal layer 12 at the side of the LED structure composed of the epitaxial growth layer by thermocompression bonding by forming both the metal layer 33 and the metal layer 12 with the Au layer. The air gap 40 is provided between the metal layer 33 of the trench region, and the metal layer 12. Accordingly, the adhesion of the metal layer 33 and the metal layer 12 disposed on the surface of the GaAs layer 15 can be kept satisfactory, a barrier metal becomes unnecessary, and the metallic reflecting layer with a sufficient reflection factor can be formed.

The conditions of wafer bonding are about 250 degrees C. to 700 degrees C., for example, and are 300 degrees C. to 400 degrees C. preferable, and the pressure of thermocompression bonding is about 10 MPa to 20 MPa, for example. The contact area of the metal layer 33 and the metal layer 12 is decreasing as compared with a structure of bonding the whole surface by providing the air gap 40. As a result, the pressure of the above-mentioned thermocompression bonding is pressurized by the contact area of the metal layer 33 and the metal layer 12 to which the contact area reduced relatively by providing the air gap 40, and the bonding strength becomes high at the time of thermocompression bonding of the metal layer 33 and the metal layer 12. Therefore, when bonding the GaAs substrate structure and the LED structure composed of epitaxial growth layers, the adhesion of the metal layer 33 and the metal layer 12 disposed on the surface of the GaAs layer 15 can be kept satisfactory by providing the air gap 40.

In the structure of FIG. 25 and FIG. 26, the metal buffer layer 34 formed at the back side of the GaAs substrate 15 is formed, for example of an AuGe—Ni alloy layer, and the thickness is about 100 nm. Moreover, the back surface electrode layer 35 is formed of an Au layer, and the thickness is about 500 nm. The metal buffer layer 32 formed on the surface of the GaAs substrate 15 is formed, for example of an AuGe—Ni alloy layer, and the thickness is about 100 nm. Furthermore, the metal layer 33 is formed of an Au layer, and the thickness is about 1 μm.

Since each process of the fabrication method of the semiconductor light emitting device according to the fourth embodiment shown in FIG. 15 to FIG. 16 and FIG. 19 to FIG. 24 is the same also in the fabrication method of the semiconductor light emitting device according to the modified example of the fourth embodiment, the explanation is omitted.

The schematic plane pattern structure of LED applied to the semiconductor light emitting device and the fabrication method for such semiconductor light emitting device according to the modified example of the fourth embodiment can also apply the same structure as FIG. 17 or FIG. 18.

Moreover, it is also available to form the metal buffer layer 18 (refer to FIG. 10) composed of Ag, Al, etc. between the insulating layer 17 and the metal layer 12 explained in the modified example of the second embodiment, also in the semiconductor light emitting device according to the fourth embodiment and its modified example. It is because the light of short wavelength, such as ultraviolet rays having a low reflection factor, can be efficiently reflected at Au by forming the metal buffer layer 18 composed of Ag, Al, etc.

According to the semiconductor light emitting device according to the fourth embodiment and its modified example, and the fabrication method for such semiconductor light emitting device, the high brightness of LED can be achieved since contact the epitaxial growth layer 26 with the metal layer 12 can be avoided, the optical absorption can be prevented, and the metallic reflecting layer having a sufficient reflection factor can be formed by intervening the transparent insulating layer 17 between the metallic reflecting layer and the semiconductor layer.

Moreover, according to the semiconductor light emitting device according to the fourth embodiment and its modified example, and the fabrication method for such semiconductor light emitting device, the light of short wavelength, such as ultraviolet rays having a low reflection factor, can be efficiently reflected at Au, and the high brightness of the LED can be achieved, by forming the metal buffer layer 18 composed of Ag, Al, etc. between the insulating layer 17 and the metal layer 12.

Moreover, according to the semiconductor light emitting device according to the fourth embodiment and its modified example, and the fabrication method for such semiconductor light emitting device, the high brightness of the LED can be achieved since the contact with the epitaxial growth layer 26 and the metal layer 12 is avoided and the light is not absorbed in the interface between the epitaxial growth layer 26 and the metallic reflecting layer.

According to the semiconductor light emitting device according to the fourth embodiment and its modified example, and the fabrication method for such semiconductor light emitting device, the high brightness of the LED can be performed since it becomes possible to perform the total reflection of the light by using the metal for the reflecting layer in order to prevent the optical absorption in the silicon substrate or the GaAs substrate, to prevent the absorption in the silicon substrate or the GaAs substrate, and to reflect the light of all angles.

Other Embodiments

The present invention has been described by the first to fourth embodiments, as a disclosure including associated description and drawings to be construed as illustrative, not restrictive. With the disclosure, artisan might easily think up alternative embodiments, embodiment examples, or application techniques.

In the semiconductor light emitting device and the fabrication method for such semiconductor light emitting device according to the first to fourth embodiment of the present invention, although the silicon substrate and the GaAs substrate are mainly explained to the example as the semiconductor substrate, it is available enough in Ge, SiGe, SiC, GaN substrate, or a GaN epitaxial substrate on SiC.

Although the LED is mainly explained to the example as the semiconductor light emitting device according to the first to fourth embodiment of the present, an LD (Laser Diode) may be composed, and in that case, a DFB (Distributed Feedback) LD, a DBR (Distributed Bragg Reflector) LD, a VCSEL (Vertical Cavity Surface Emitting Laser Diode), etc. may be composed.

Such being the case, the present invention covers a variety of embodiments, whether described or not.

INDUSTRIAL APPLICABILITY

The semiconductor light emitting device according to the present invention can be used for whole semiconductor light emitting devices, such as an LED device having a non-transparent substrate, such as a GaAs substrate and a Si substrate, and an LD device.

The invention claimed is:

1. A semiconductor light emitting device comprising:
a GaAs substrate structure including
a GaAs layer forming a plurality of trench regions on a surface,
a first metal buffer layer disposed on the surface of the GaAs layer, at a sidewall of the trench region, and on a bottom surface of the trench region,
a first metal layer disposed on the first metal buffer layer,
a second metal buffer layer disposed at a back side of the GaAs layer, and
a second metal layer disposed on a surface of the opposite side with the GaAs layer of the second metal buffer layer; and
a light emitting diode structure disposed on the GaAs substrate structure and including
a third metal layer,
a metal contact layer disposed on the third metal layer,
a p type cladding layer disposed on the metal contact layer,
a multi-quantum well layer disposed on the p type cladding layer,
an n type cladding layer disposed on the multi-quantum well layer, and
a window layer disposed on the n type cladding layer, wherein
the GaAs substrate structure and the light emitting diode structure are bonded using the first metal layer and the third metal layer disposed on the surface of the GaAs layer, and an air gap exists between the first metal layer of the trench region and the third metal layer.

2. The semiconductor light emitting device according to claim 1, wherein a conductivity type of the GaAs layer is a p type.

3. The semiconductor light emitting device according to claim 1, wherein a conductivity type of the GaAs layer is an n type.

4. The semiconductor light emitting device according to claim 1, wherein a metallic reflecting layer is formed of the third metal layer disposed beforehand in the light emitting diode structure side.

5. The semiconductor light emitting device according to claim 1, wherein the GaAs substrate structure and the light emitting diode structure are bonded by bonding the first metal layer and the third metal layer disposed on the surface of the GaAs layer by thermocompression bonding.

6. A semiconductor light emitting device comprising:
a GaAs substrate forming a plurality of trench regions on a surface; and
a light emitting diode structure including
a metal layer disposed on the surface of the GaAs substrate, at a sidewall of the trench region, and on a bottom surface of the trench region,
a patterned metal contact layer and a patterned insulating layer disposed on the metal layer on the surface of the GaAs substrate,
a p type cladding layer disposed on the patterned metal contact layer and the patterned insulating layer,
a multi-quantum well layer disposed on the p type cladding layer,
an n type cladding layer disposed on the multi-quantum well layer, and
a window layer disposed on the n type cladding layer, wherein
the GaAs substrate and the light emitting diode structure are bonded using the metal layer on the surface of the GaAs substrate, and an air gap exists between the metal layer of the trench region and the light emitting diode structure.

7. The semiconductor light emitting device according to claim 6 further comprising a metal buffer layer disposed on the metal layer between the metal layer, and the patterned metal contact layer and the patterned insulating layer.

8. The semiconductor light emitting device according to claim 6, wherein the GaAs substrate structure and the light emitting diode structure are bonded by bonding the metal layer on the surface of the GaAs substrate with the GaAs substrate by thermocompression bonding.

9. A semiconductor light emitting device comprising:
a GaAs substrate structure including
a GaAs substrate forming a plurality of trench regions on a surface, and
a first metal layer disposed on the surface of the GaAs substrate, at a sidewall of the trench region, and on a bottom surface of the trench region; and
a Light emitting diode structure disposed on the GaAs substrate structure and including
a second metal layer,
a p type cladding layer disposed on the second metal layer,
a multi-quantum well layer disposed on the p type cladding layer,
an n type cladding layer disposed on the multi-quantum well layer, and
a window layer disposed on the n type cladding layer, wherein
the GaAs substrate and the light emitting diode structure are bonded using the first metal layer and the second metal layer on the surface of the GaAs substrate, and an air gap exists between the first metal layer of the trench region and the light emitting diode structure.

10. The semiconductor light emitting device according to claim 9 wherein the GaAs substrate structure and the light emitting diode structure are bonded by bonding the first metal layer and the second metal layer on the surface of the GaAs substrate by thermocompression bonding.

11. A semiconductor light emitting device comprising:
a silicon substrate structure including
a silicon substrate forming a plurality of trench regions on a surface,
a titanium layer disposed on the surface of the silicon substrate, at a sidewall of the said trench region, and on a bottom surface of the trench region, and
a first metal layer disposed on the titanium layer; and
an LED structure including
a second metal layer disposed on the first metal layer,
a patterned metal contact layer and a patterned insulating layer disposed on the second metal layer, an epitaxial growth layer disposed on the patterned metal contact layer and the patterned insulating layer and having a frosting processing region on a surface exposed, a patterned n type GaAs layer disposed on the epitaxial growth layer, and a patterned surface electrode layer disposed on the n type GaAs layer, wherein the silicon substrate structure and the light emitting diode structure are bonded using the first metal layer and the second metal layer on the surface of the silicon substrate, and an air gap exists between the first metal layer of the trench region and the LED structure.

12. The semiconductor light emitting device according to claim 11, wherein a back surface electrode layer is disposed at the back side of the silicon substrate and a blocking layer for preventing current concentration is disposed between the epitaxial growth layer and the n type GaAs layer, in the silicon substrate structure.

13. The semiconductor light emitting device according to claim 12, wherein the blocking layer is formed of GaAs.

14. The semiconductor light emitting device according to claim 11 wherein the silicon substrate structure and the light emitting diode structure are bonded by bonding the first metal layer and the second metal layer on the surface of the silicon substrate by thermocompression bonding.

15. A semiconductor light emitting device comprising:
a GaAs substrate structure including
a GaAs substrate forming a plurality of trench regions on a surface,
a metal buffer layer disposed on the surface of the GaAs substrate, at a sidewall of the trench region, and on a bottom surface of the trench region, and
a first metal layer disposed on the metal buffer layer; and
an LED structure including
a second metal layer disposed on the first metal layer,
a patterned metal contact layer and a patterned insulating layer disposed on the second metal layer,
an epitaxial growth layer disposed on the patterned metal contact layer and the patterned insulating layer and having a frosting processing region on a surface exposed,
a patterned n type GaAs layer disposed on the epitaxial growth layer, and
a patterned surface electrode layer disposed on the n type GaAs layer, wherein
the GaAs substrate structure and the light emitting diode structure are bonded using the first metal layer and the second metal layer on the surface of the GaAs substrate, and an air gap exists between the first metal layer of the trench region and the LED structure disposed on the second metal layer.

16. The semiconductor light emitting device according to claim 15, wherein a back surface electrode layer is disposed at the back side of the GaAs substrate and a blocking layer for preventing current concentration is disposed between the epitaxial growth layer and the n type GaAs layer, in the GaAs substrate structure.

17. The semiconductor light emitting device according to claim 15 wherein the GaAs substrate structure and the light emitting diode structure are bonded by bonding the first metal layer and the second metal layer on the surface of the GaAs substrate by thermocompression bonding.

18. The semiconductor light emitting device according to claim 15 further comprising a metal buffer layer disposed on the metal layer, and between the metal layer, and the patterned metal contact layer and the patterned insulating layer.

19. A fabrication method for a semiconductor light emitting device comprising:
preparing a semiconductor substrate structure for wafer bonding and a light emitting diode structure for wafer bonding;
forming a first metal layer on a semiconductor substrate after forming a plurality of trench regions on a surface of the semiconductor substrate, in the semiconductor substrate structure;
forming an AlInGaP layer, an n type GaAs layer, and an epitaxial growth layer one after another on a GaAs substrate, in the light emitting diode structure;
forming a metal contact layer and a second metal layer for a patterned insulating layer, on the epitaxial growth layer;
bonding the semiconductor substrate and the LED structure for wafer bonding by thermocompression bonding using the first metal layer on the surface of the semiconductor substrate, and forming an air gap between the first metal layer of the trench region and the LED structure;
removing the GaAs substrate by etching;
removing the AlInGaP layer;
performing pattern formation of a surface electrode layer; and
removing the n type GaAs layers except the n type GaAs layer directly under the surface electrode layer by performing frosting processing.

20. The fabrication method for the semiconductor light emitting device according to claim 19 further comprising forming a blocking layer for preventing current concentration before the performing the pattern formation of the surface electrode layer after the removing the AlInGaP layer.

* * * * *